(12) United States Patent
Kikuchi et al.

(10) Patent No.: US 8,956,881 B2
(45) Date of Patent: Feb. 17, 2015

(54) METHOD OF MANUFACTURING A FERAM DEVICE

(71) Applicant: Fujitsu Semiconductor Limited, Yokohama (JP)

(72) Inventors: Hideaki Kikuchi, Kawasaki (JP); Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/769,287

(22) Filed: Feb. 16, 2013

(65) Prior Publication Data

US 2013/0161790 A1 Jun. 27, 2013

Related U.S. Application Data

(60) Division of application No. 12/541,639, filed on Aug. 14, 2009, now abandoned, which is a continuation of application No. PCT/JP2007/055130, filed on Mar. 14, 2007.

(51) Int. Cl.
  *H01L 21/00* (2006.01)
  *H01L 27/115* (2006.01)
  *H01L 49/02* (2006.01)
  *H01L 27/04* (2006.01)

(52) U.S. Cl.
  CPC .......... *H01L 27/11502* (2013.01); *H01L 28/60* (2013.01); *H01L 27/04* (2013.01); *H01L 27/11507* (2013.01); *H01L 28/55* (2013.01); *H01L 28/65* (2013.01)
  USPC .................. 438/3; 257/E21.664; 257/E27.104

(58) Field of Classification Search
  USPC .................................................. 257/E21.664
  See application file for complete search history.

(56) References Cited

U.S. PATENT DOCUMENTS

| | | | |
|---|---|---|---|
| 6,611,014 B1 | 8/2003 | Kanaya et al. | |
| 6,982,453 B2 | 1/2006 | Kanaya et al. | |
| 7,029,925 B2 | 4/2006 | Celii et al. | |

(Continued)

FOREIGN PATENT DOCUMENTS

| | | |
|---|---|---|
| JP | 2002-43540 A | 2/2002 |
| JP | 2003-318371 | 11/2003 |

(Continued)

OTHER PUBLICATIONS

Japanese Office Action mailed Jun. 12, 2012 for corresponding Japanese Application No. 2009-503839, with Partial English-language Translation.

(Continued)

*Primary Examiner* — Daniel Luke
(74) *Attorney, Agent, or Firm* — Fujitsu Patent Center

(57) ABSTRACT

A lower electrode film, a ferroelectric film, and an upper electrode film are formed on an insulation film covering a transistor formed on a semiconductor substrate. Furthermore, a Pt film is formed as a cap layer on the upper electrode film. Then, a hard mask (a TiN film and an SiO$_2$ film) of a predetermined pattern is formed on the Pt film, and the Pt film and the upper electrode film are etched. Then, an insulating protective film is formed on an entire surface, and a side surface of the upper electrode film is covered with the insulating protective film. Next, the ferroelectric film and the lower electrode film are etched, thus forming a ferroelectric capacitor.

5 Claims, 31 Drawing Sheets

(56) References Cited

U.S. PATENT DOCUMENTS

| | | | |
|---|---|---|---|
| 7,755,125 B2 * | 7/2010 | Wang | 257/295 |
| 2003/0143853 A1 | 7/2003 | Celii et al. | |
| 2003/0215960 A1 | 11/2003 | Mitsuhasi | |
| 2004/0084701 A1 * | 5/2004 | Kanaya et al. | 257/295 |
| 2004/0157459 A1 | 8/2004 | Ying et al. | |
| 2006/0008965 A1 * | 1/2006 | Aggarwal et al. | 438/200 |
| 2007/0228431 A1 * | 10/2007 | Wang | 257/295 |
| 2007/0228511 A1 * | 10/2007 | Matsuura | 257/528 |
| 2008/0003700 A1 * | 1/2008 | Wang et al. | 438/3 |
| 2008/0064124 A1 * | 3/2008 | Wang | 438/3 |

FOREIGN PATENT DOCUMENTS

| | | |
|---|---|---|
| JP | 2003-338608 A | 11/2003 |
| JP | 3666877 | 6/2005 |
| WO | WO-97/35341 | 9/1997 |

OTHER PUBLICATIONS

International Search Report of PCT/JP2007/055130, Mailing Date of Jun. 19, 2007.
USPTO, (Luke) Final Rejection, Aug. 16, 2012, in U.S. Appl. No. 12/541,639 [pending].
USPTO, (Luke) Non-Final Rejection, Dec. 30, 2011, in U.S. Appl. No. 12/541,639 [pending].
USPTO, (Yeung Lopez) Restriction Requirement, Nov. 25, 2011, in U.S. Appl. No. 12/541,639 [pending].
USPTO, (Yeung Lopez) Restriction Requirement, Jul. 14, 2011, in U.S. Appl. No. 12/541,639 [pending].

* cited by examiner

FIG.1G (RELATED ART)
FIG.1H (RELATED ART)
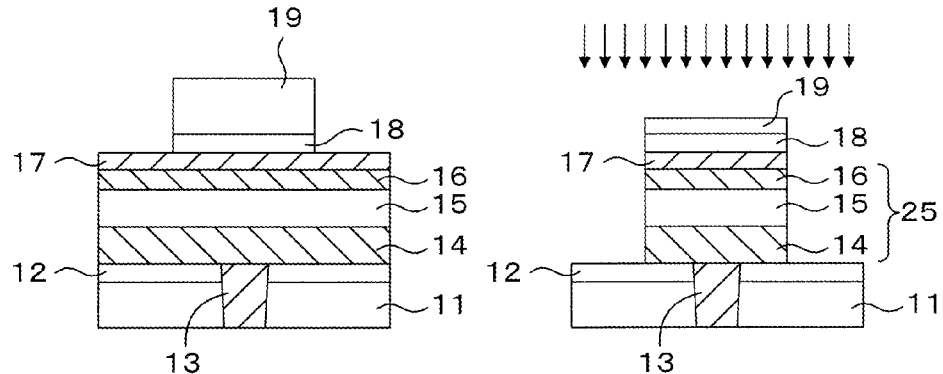
FIG.1I (RELATED ART)
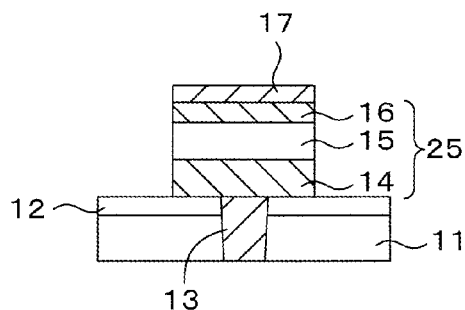
FIG.2 (RELATED ART)
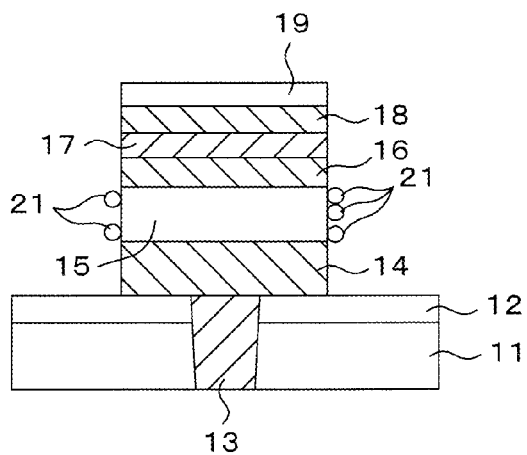

METHOD OF MANUFACTURING A FERAM DEVICE

CROSS-REFERENCE TO RELATED APPLICATIONS

This application is a divisional of application Ser. No. 12/541,639, filed Aug. 14, 2009, which is a continuation of the prior International Patent Application No. PCT/JP2007/055130, filed Mar. 14, 2007, the entire contents of which are incorporated herein by reference.

FIELD

The embodiments discussed herein relate to a semiconductor device including a ferroelectric capacitor of a structure in which a ferroelectric film is sandwiched between a pair of electrodes, and a method of manufacturing the semiconductor device.

BACKGROUND

In recent years, development has been underway for a semiconductor device including a ferroelectric capacitor (Ferroelectric Random Access Memory: hereinafter referred to as "FeRAM") which stores information utilizing hysteresis characteristics of ferroelectrics. FeRAM is a nonvolatile memory which does not lose information even after being powered off, and has advantageous characteristics that it can achieve high degree of integration, high speed drive, high durability and low power consumption. A ferroelectric capacitor used in FeRAM has a structure in which a pair of electrodes sandwiches a film (ferroelectric film) made of a ferroelectric oxide, such as PZT (Pb(Zr, Ti)O$_3$) or SBT (SrBi$_2$Ta$_2$O$_9$), having a large residual polarization quantity.

FIGS. 1A to 1I are schematic sectional views depicting, in process sequence, one example of a related method of manufacturing FeRAM.

First, as depicted in FIG. 1A, after a transistor (not depicted) is formed on a semiconductor substrate (not depicted), an interlayer insulation film 11 covering the transistor is formed and an SiN film 12 is formed on the interlayer insulation film 11. Then, a contact hole running from a surface of the SiN film 12 to the transistor is formed using a photolithographic method, and a plug 13 is formed by embedding W (tungsten) in the contact hole.

Then, as depicted in FIG. 1B, a lower electrode film 14 made of Ir (Iridium), a ferroelectric film (PZT film) 15, and an upper electrode film 16 made of IrOx (iridium oxide) are formed on the SiN film 12 and the plug 13. Then, as depicted in FIG. 1C, a Pt (platinum) film 17, which acts as a cap layer, is formed on the upper electrode film 16. Incidentally, although the cap layer is herein provided on the upper electrode film 16, the cap layer is not provided in some cases.

Next, as depicted in FIG. 1D, a TiN film 18 is formed on the Pt film 17 and then a SiO$_2$ film (TEOS (Tetra-Ethyl-Ortho-Silicate) film) 19 is formed on the TiN film 18. Then, as depicted in FIG. 1E, a photoresist film 20 is formed on the SiO$_2$ film 19, and this photoresist film 20 is patterned into a predetermined shape.

After that, as depicted in FIG. 1F, the SiO$_2$ film 19 is etched with the photoresist film 20 as a mask. Then, as depicted in FIG. 1G, after the TiN film 18 is etched, the photoresist film 20 is removed.

Subsequently, as depicted in FIG. 1H, the Pt film 17, the upper electrode film 16, the ferroelectric film 15, and the lower electrode film 14 are collectively etched with the remaining SiO$_2$ film 19 and TiN film 18 as a hard mask. With this, a ferroelectric capacitor 25 having a structure in which the ferroelectric film 15 is sandwiched between the lower electrode film 14 and the upper electrode film 16 is formed. Thereafter, as depicted in FIG. 1I, the hard mask (the SiO$_2$ film 19 and the TiN film 18) is removed by dry etching and wet etching. Thus, a semiconductor device including the ferroelectric capacitor 25 is completed.

In this regard, when stack type ferroelectric capacitors are manufactured, the upper electrode film 16 to the lower electrode film 14 (the cap layer to the lower electrode film, if there is any cap layer) are collectively etched as depicted in FIGS. 1A to 1I. A semiconductor substrate is heated to high temperature (400° C., for example) to improve reactivity during the collective etching, and becomes susceptible to oxidation. The upper electrode film 16 and the lower electrode film 14 are exposed to high temperature also in a crystallization process and a recovery anneal process of the ferroelectric film. This is a reason why materials for the upper electrode film 16 and the lower electrode film 14 are required to have nonoxidizing properties or conductive properties that do not deteriorate even if the materials are oxidized. Thus, noble metals such as Ir are used as described above. However, since noble metals have poor reactivity, conductive particles generated from etching are not easily discharged from an etching chamber. As depicted in FIG. 2, conductive particles 21 may adhere to a side surface of the ferroelectric film 15 and cause a short between the lower electrode film 14 and the upper electrode film 16.

In addition, an etching mask is required to be heat resistant, and a photoresist (resin) cannot be used. Thus, a hard mask composed of an SiO$_2$ film and a TiN film is used in collective etching as described above. In the step of removing the hard mask after the end of etching, however, conductive particles 21 may also be generated and adhere to the side surface of the ferroelectric film 15. The conductive particles 21 adhered to the side surface of the ferroelectric film 15 are difficult to remove even with a drug solution of hydroxylamine or an acid solution or the like.

Patent Document 1 discloses a semiconductor device including a multilayer capacitor. In the semiconductor device, a sidewall is formed on sides of a capacitor insulation film and of an upper electrode film in order to prevent conductive particles generated in etching of a metal film from adhering to the sides of the capacitor insulation film and thus to prevent a short from occurring between the capacitor electrodes. The sidewall is formed by patterning the upper electrode film and the capacitor insulation film, then forming a thick insulation film made of an insulator such as SiO$_2$, Si$_3$N$_4$, Al$_2$O$_3$, TiO$_3$ or Ta$_2$O$_5$ on an entire surface by a CVD (Chemical Vapor Deposition) method, and etching back the insulation film. According to Patent Document 1, adherence of conductive particles is prevented by making a top of the sidewall to have a taper angle of 75° or smaller.

However, in the method described in Patent Document 1, since a thick insulation film is formed on a substrate, and a sidewall is formed by etching back the insulation film, it is difficult to determine the time to finish etching. Thus, overetching may cause chipping or stripping of the sidewall or the upper electrode film. In addition, there is also a problem that the method described in Patent Document 1 requires the taper angle of the top of the sidewall to be 75° or smaller, which results in an increase in thickness of the sidewall and thus makes it difficult to achieve high integration of the semiconductor device.

Furthermore, in Patent Document 1, the sidewall is made by covering a ferroelectric capacitor with an insulation film formed by the CVD method and etching back the insulation film. However, when the insulation film covering the ferroelectric capacitor is formed by a normal CVD method (such as a plasma CVD method or a thermal CVD method), the properties of ferroelectric capacitors may degrade due to hydrogen gas contained in a CVD gas, and heating, or plasma damage in the plasma CVD method. In addition, although Patent Document 1 discloses an example in which the sidewall is made of $SiO_2$ or $TiO_2$, there is another problem that the sidewall made of $SiO_2$ has such low barrier properties to hydrogen or moisture that the capacitor easily deteriorates in etching processing. Furthermore, there is yet another problem that when a ferroelectric capacitor is coated with a $TiO_2$ film, Ti is dispersed in PZT and the properties of PZT may deteriorate.

There is another related technique described in Patent Document 2 considered as related to the embodiments. Patent Document 2 describes etching of a ferroelectric film under specific conditions using high-temperature $BCl_3$ in forming a capacitor of FeRAM with use of a hard mask. Patent Document 2 states that etching with use of the high-temperature $BCl_3$ under the specific conditions can prevent conductive particles generated in etching of a lower electrode film from accumulating on a side surface of the ferroelectric film, which in turn allows prevention of a leak and a short of the ferroelectric capacitor.

In addition, Japanese Patent Application No. 2004-55319 filed by the present applicant discloses FeRAM having a structure in which: multiple lower electrodes are collectively covered with a ferroelectric film; upper electrodes opposed to the respective lower electrodes are formed on the ferroelectric film; and multiple capacitors each composed of the lower electrode, the ferroelectric film, and the upper electrode are covered with a protective film.

Patent Document 1: Japanese Patent No. 3666877
Patent Document 2: Japanese Laid-open Patent Publication No. 2003-318371

SUMMARY

According to an aspect of the embodiments, a method of manufacturing semiconductor device includes: forming an insulation film on a semiconductor substrate, forming a lower electrode film on the insulation film, forming a ferroelectric film on the lower electrode film, forming an upper electrode film on the ferroelectric film, forming a hard mask of a predetermined pattern on the upper electrode film, removing the upper electrode film of a portion uncovered with the hard mask, forming an insulating protective film on an entire upper surface of the semiconductor substrate to cover a side surface of the remaining upper electrode film with the insulating protective film, removing the ferroelectric film and the lower electrode film of a portion uncovered with the hard mask, and removing the hard mask.

According to other aspect of the embodiments, a method of manufacturing a semiconductor device includes: forming an insulation film on a semiconductor substrate, forming a lower electrode film on the insulation film, forming a ferroelectric film on the lower electrode film, forming an upper electrode film on the ferroelectric film, forming a hard mask of a predetermined pattern on the upper electrode film, removing the upper electrode film of a portion uncovered with the hard mask, forming a first insulating protective film on an entire upper surface of the semiconductor substrate to cover a side surface of the remaining upper electrode film with the first insulating protective film, removing the ferroelectric film of a portion uncovered with the hard mask, forming a second insulating protective film on the entire upper surface of the semiconductor substrate to cover a side surface of the remaining ferroelectric film with the second insulating protective film, removing the lower electrode film on the portion uncovered with the hard mask, and removing the hard mask.

According to other aspect of the embodiments, a method of manufacturing a semiconductor device includes: forming an insulation film on a semiconductor substrate, forming a lower electrode film on the insulation film, forming a ferroelectric film on the lower electrode film, forming an upper electrode film on the ferroelectric film, forming a hard mask of a predetermined pattern on the upper electrode film, removing the upper electrode film and the ferroelectric film of a portion uncovered with the hard mask, forming an insulating protective film on an entire upper surface of the semiconductor substrate to cover side surfaces of the remaining upper electrode film and the remaining ferroelectric film with the insulating protective film, removing the lower electrode film of the portion uncovered by the hard mask, and removing the hard mask.

According to yet other aspect of the embodiments, a semiconductor device includes: a semiconductor substrate, a transistor formed on the semiconductor substrate, an interlayer insulation film formed on the semiconductor substrate and covering the transistor, a ferroelectric capacitor constructed by laminating a lower electrode film, a ferroelectric film, and an upper electrode film and arranged on the interlayer insulation film, the lower electrode film being electrically connected to the transistor, and an insulating protective film having film thickness of 5 to 20 nm and covering at least side surface of the upper electrode film.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 1A to 1I are schematic sectional views depicting a related method of manufacturing FeRAM;

FIG. 2 is a schematic sectional view depicting related problems;

DESCRIPTION OF EMBODIMENTS

Hereinafter, preferred embodiments will be described with reference to the attached drawings.

First Embodiment

Figure 1A:
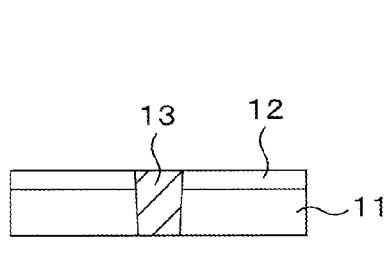
Figure 1B:
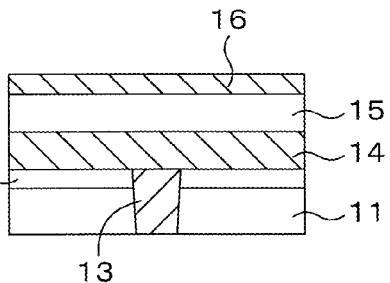
Figure 1C:
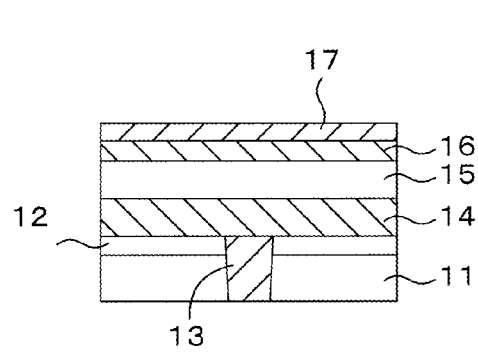
Figure 1D:
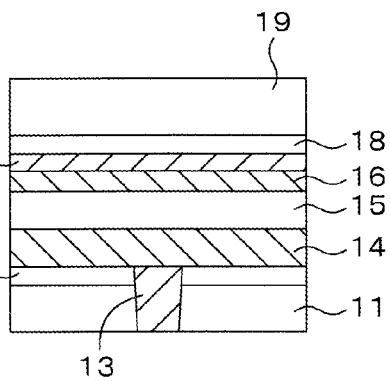
Figure 1E:
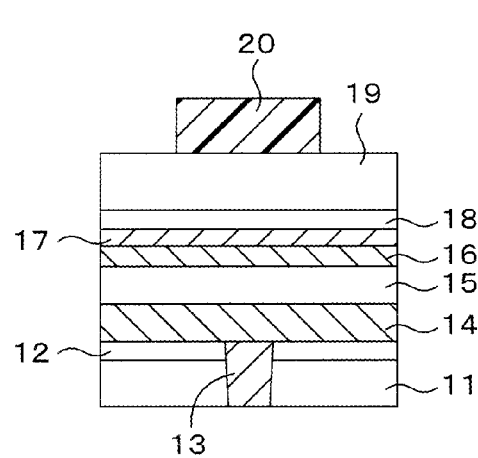
Figure 1F:
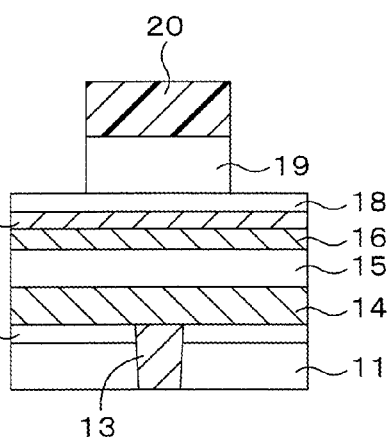
Figure 3A:
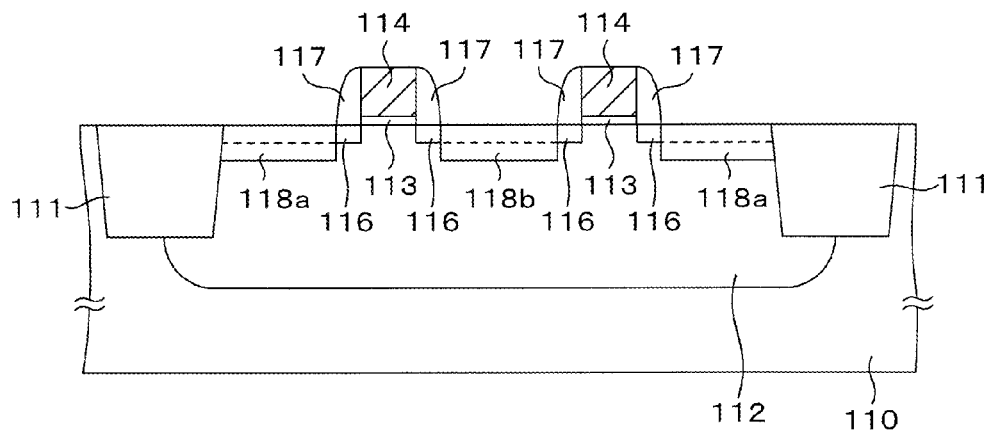
FIGS. 3A to 3T are sectional views depicting a method of manufacturing a semiconductor device according to a first embodiment.
Figure 3B:
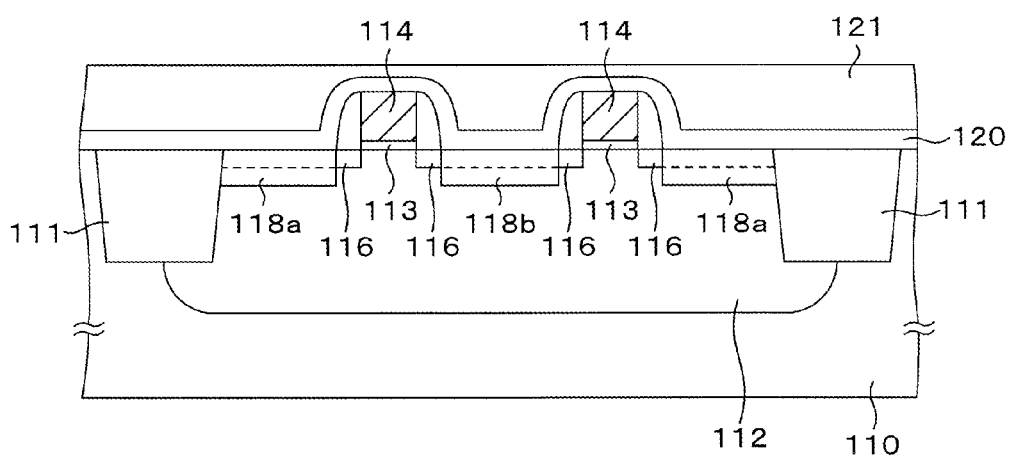
Figure 3C:
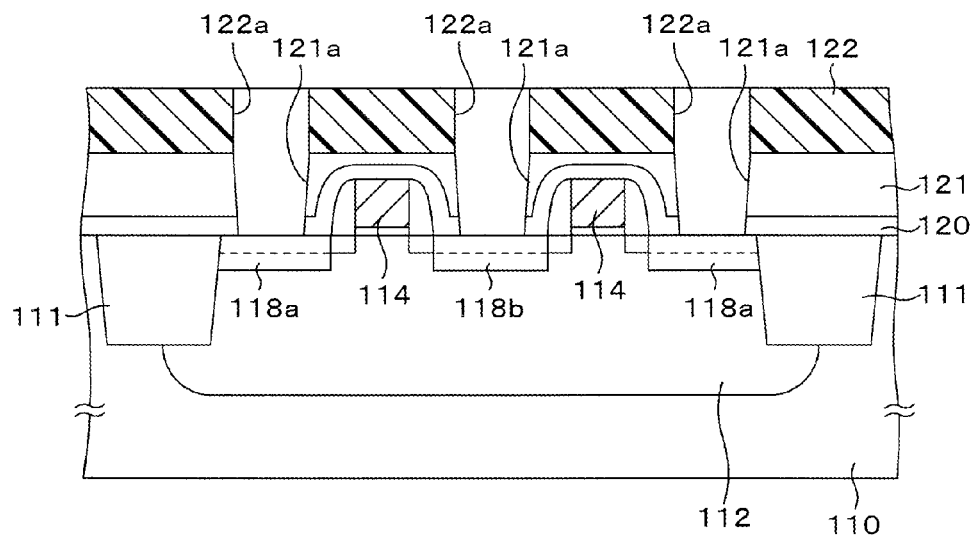
Figure 3D:
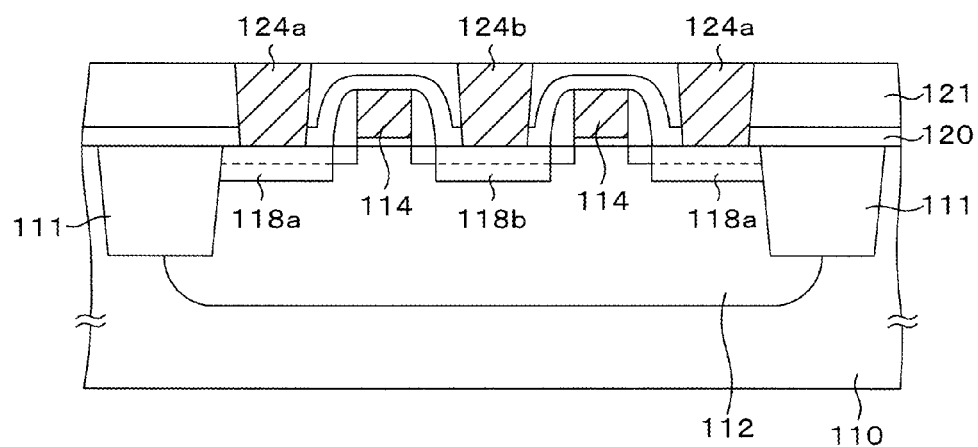
Figure 3E:
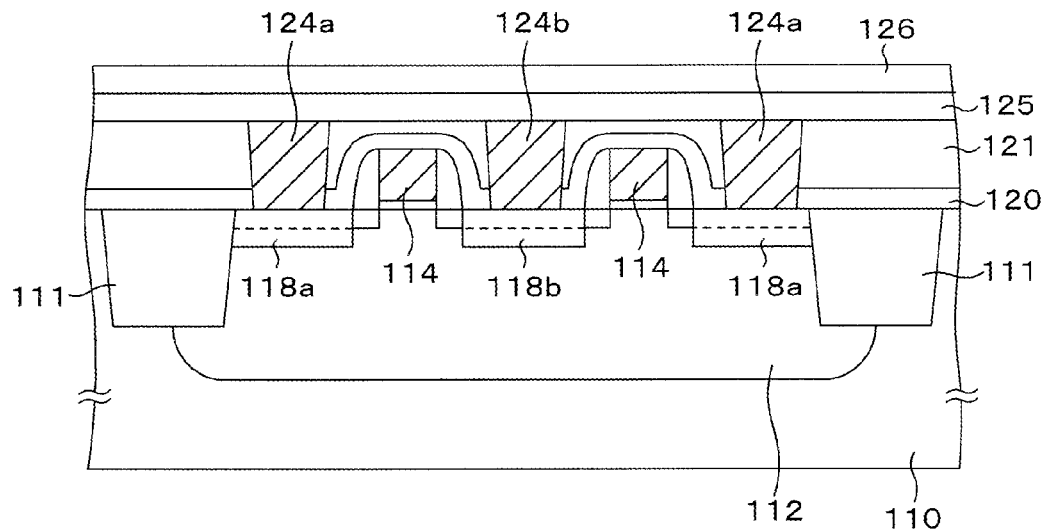
Figure 3F:
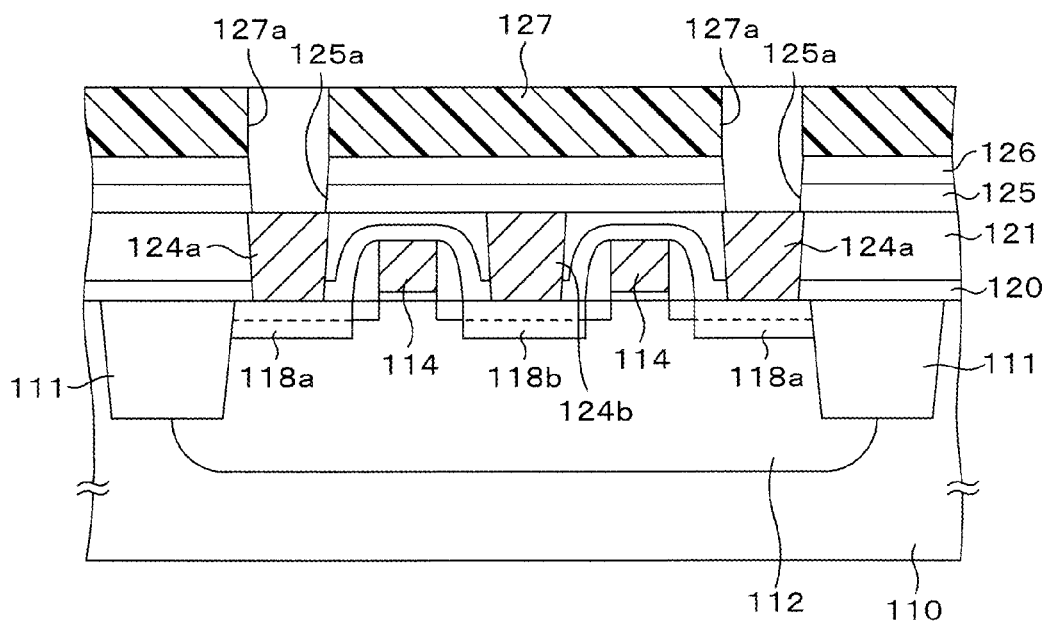
Figure 3G:
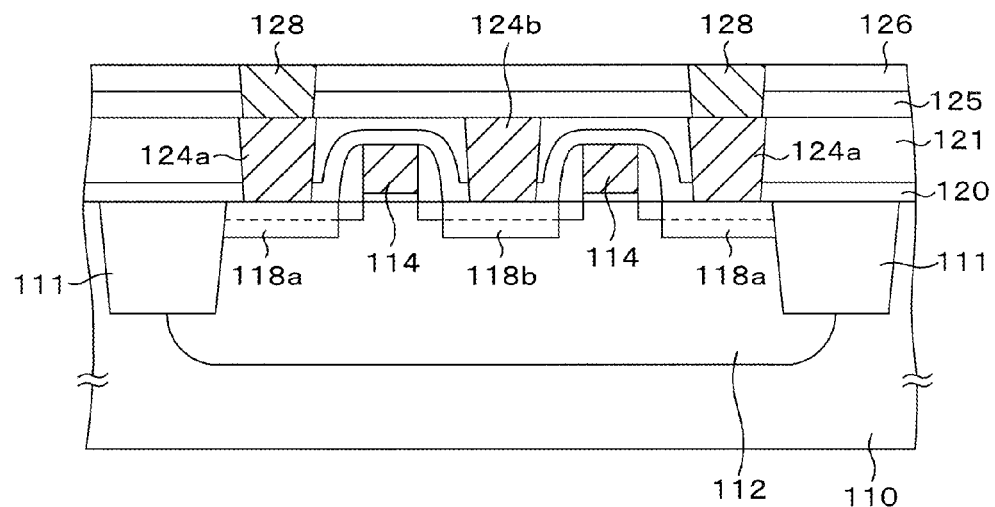
Figure 3H:
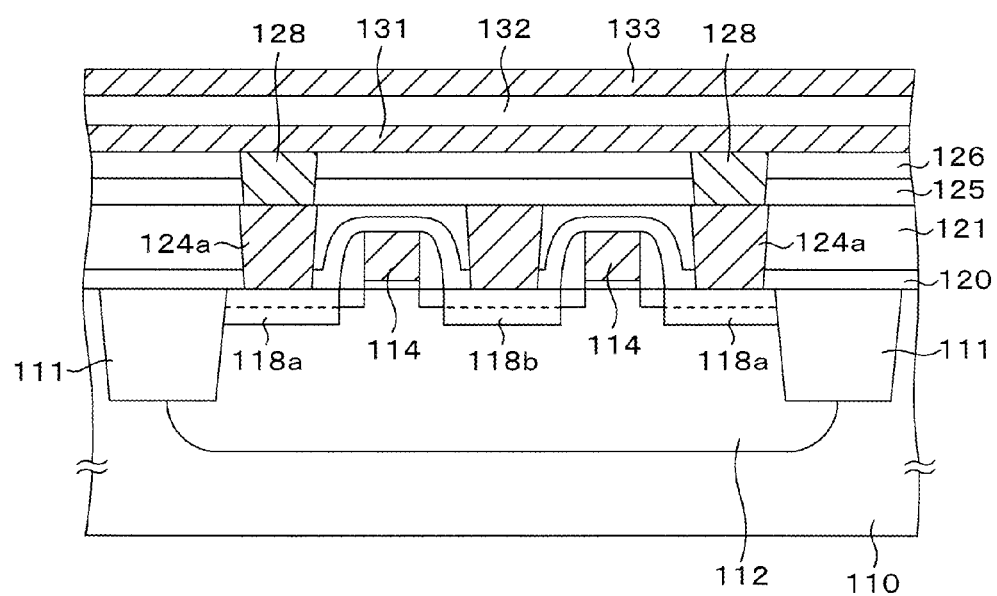
Figure 3I:
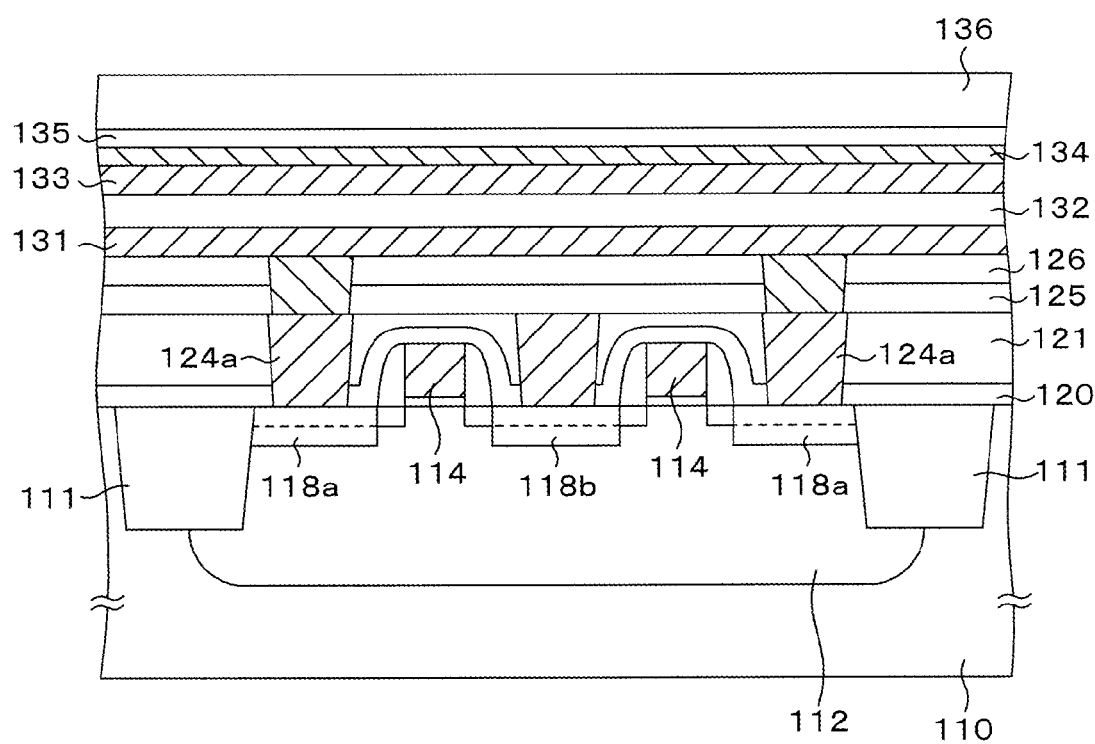
Figure 3J:
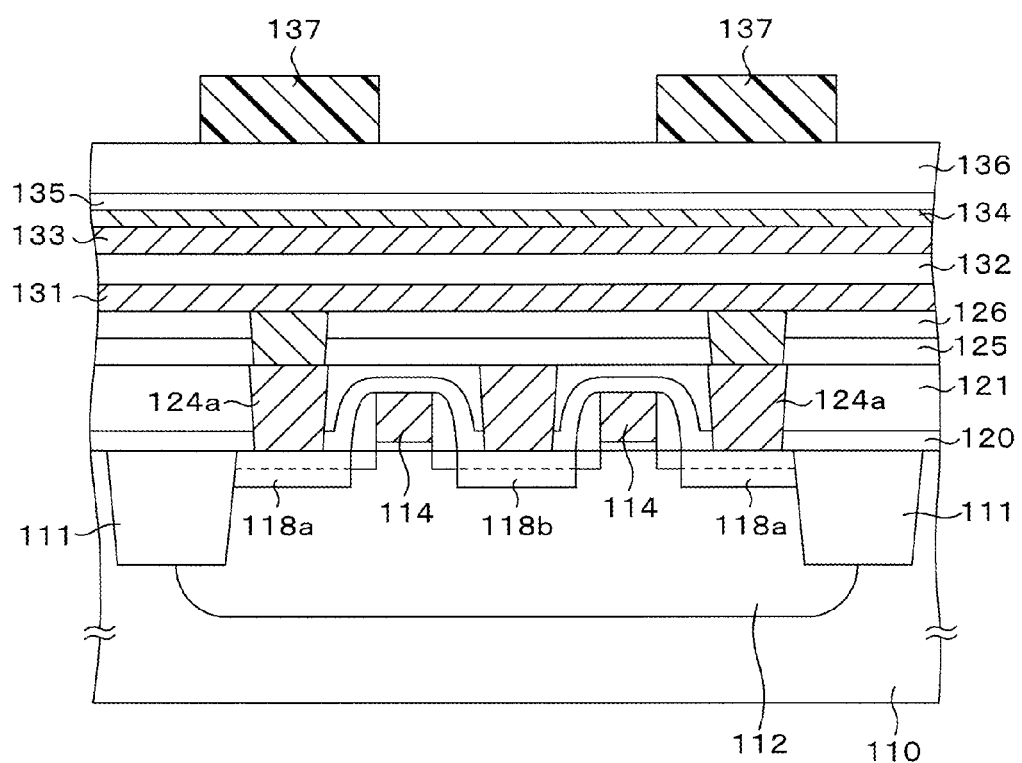
Figure 3K:
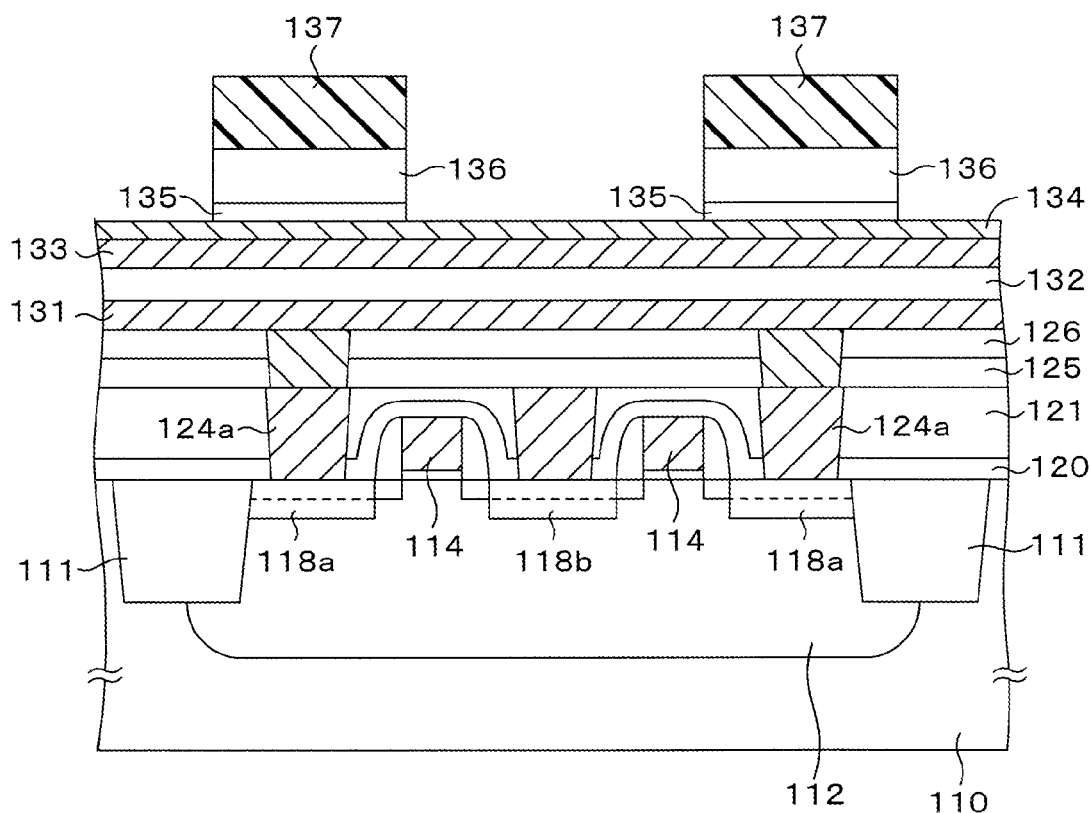
Figure 3L:
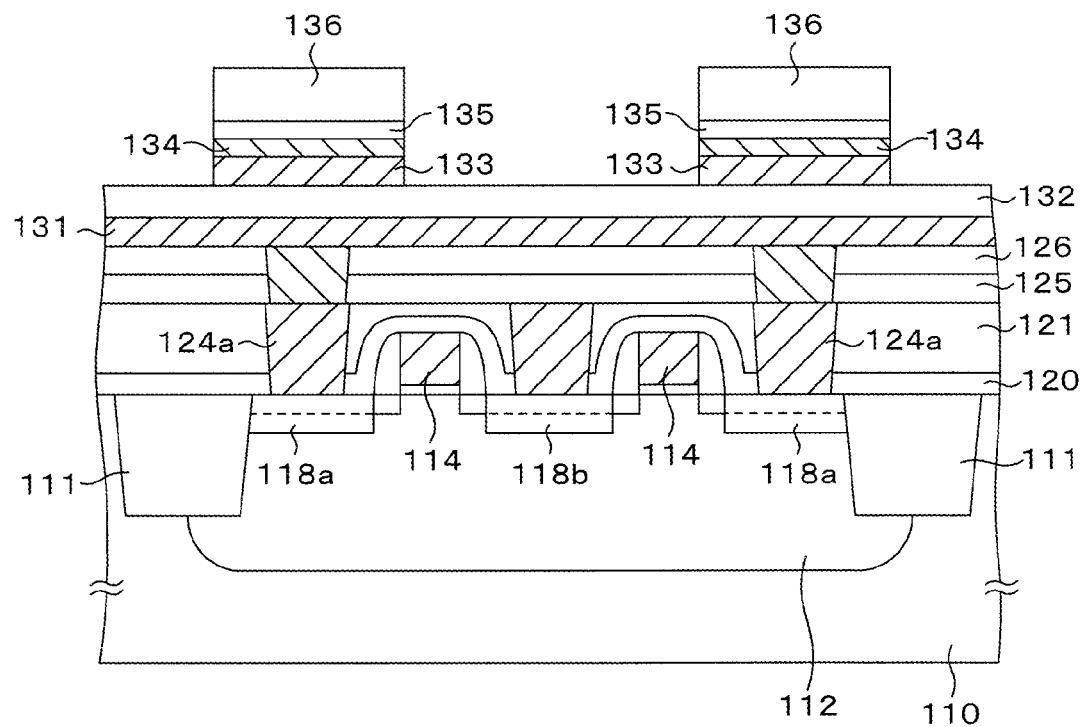
Figure 3M:
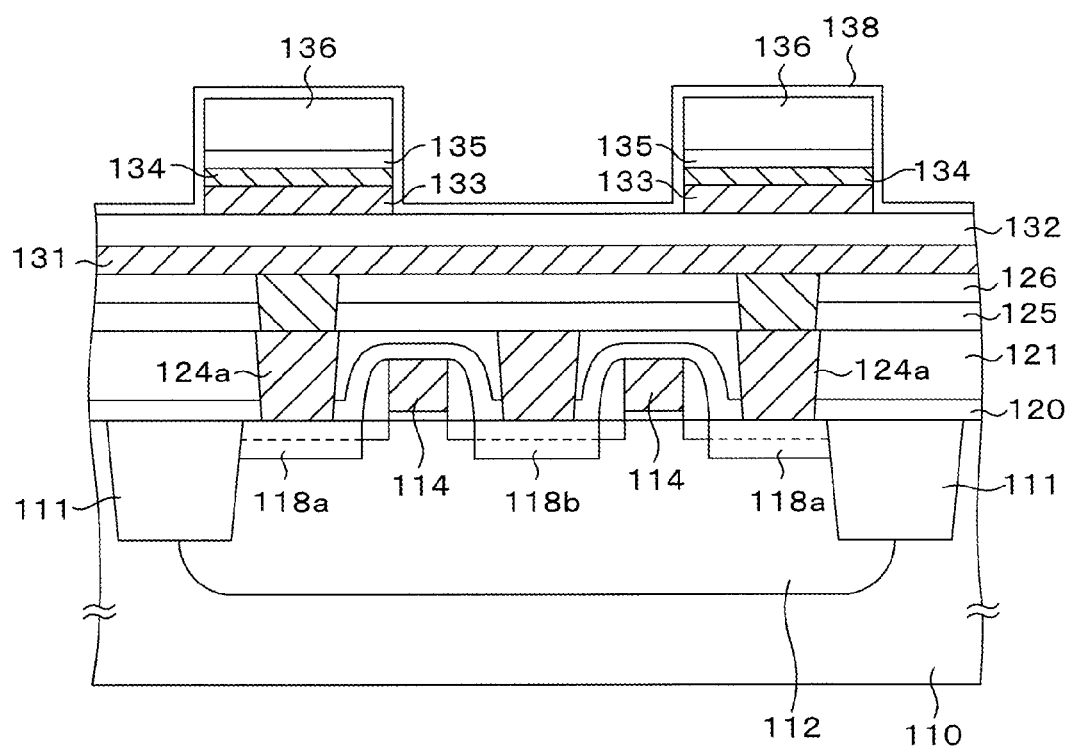
Figure 3N:
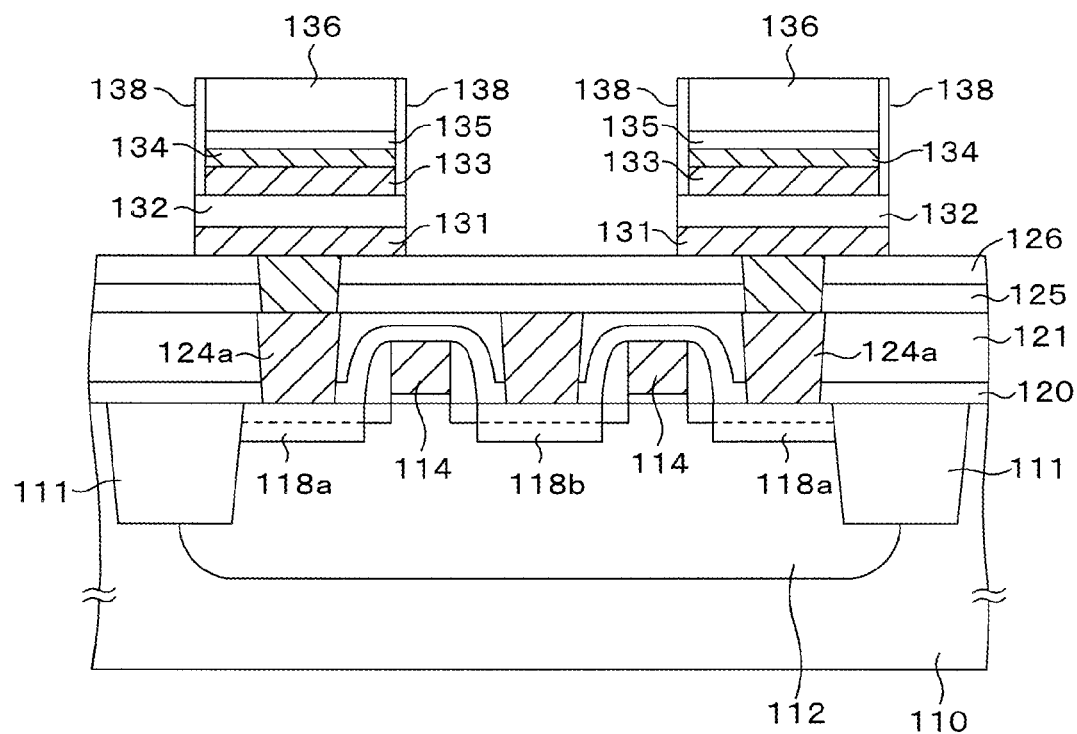
Figure 3O:
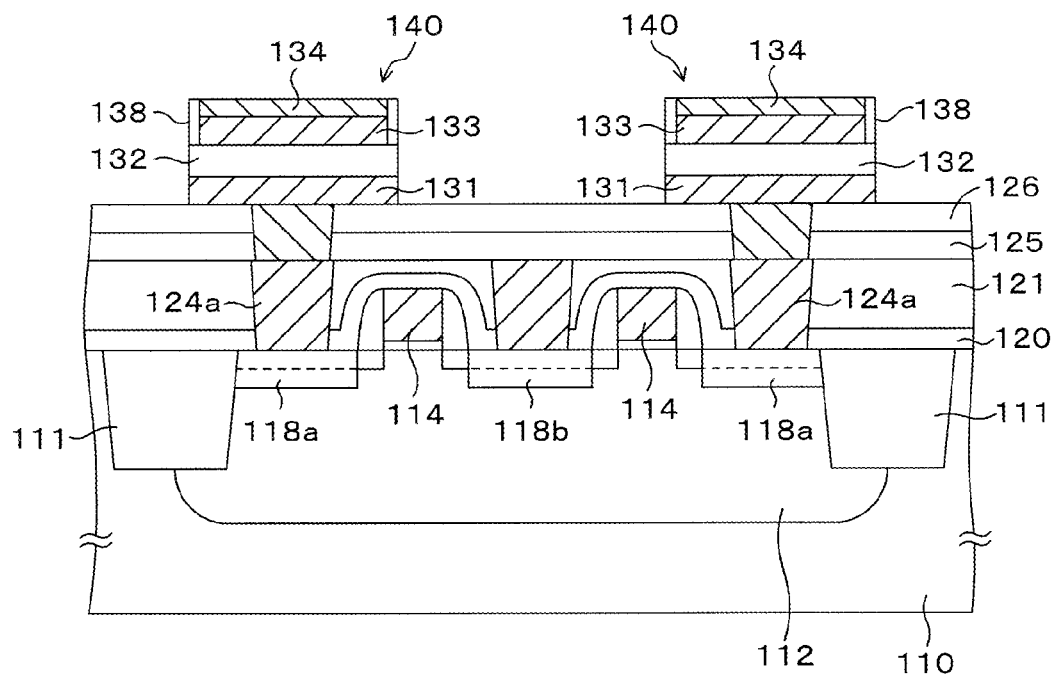
Figure 3P:
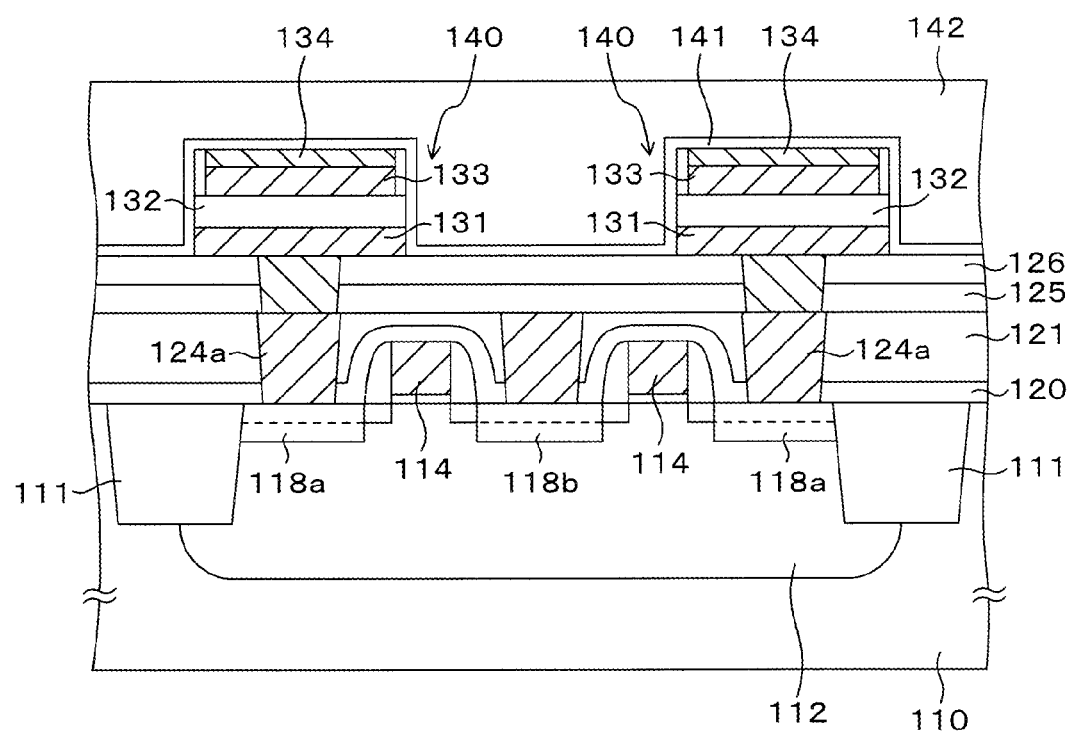
Figure 3Q:
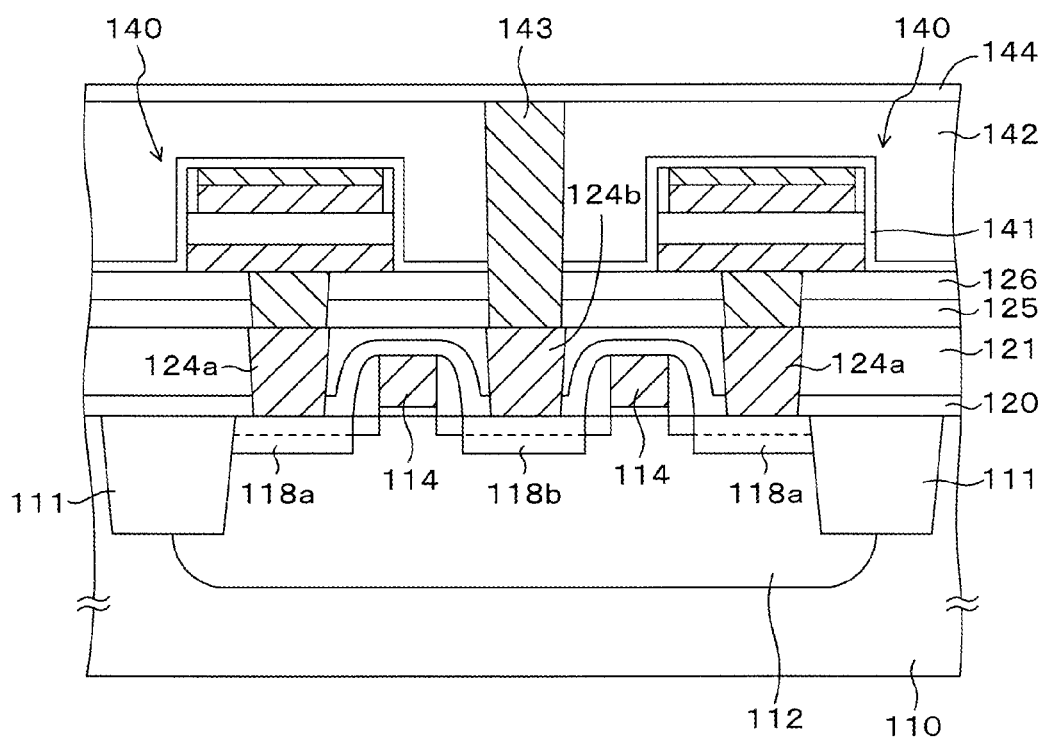
Figure 3R:
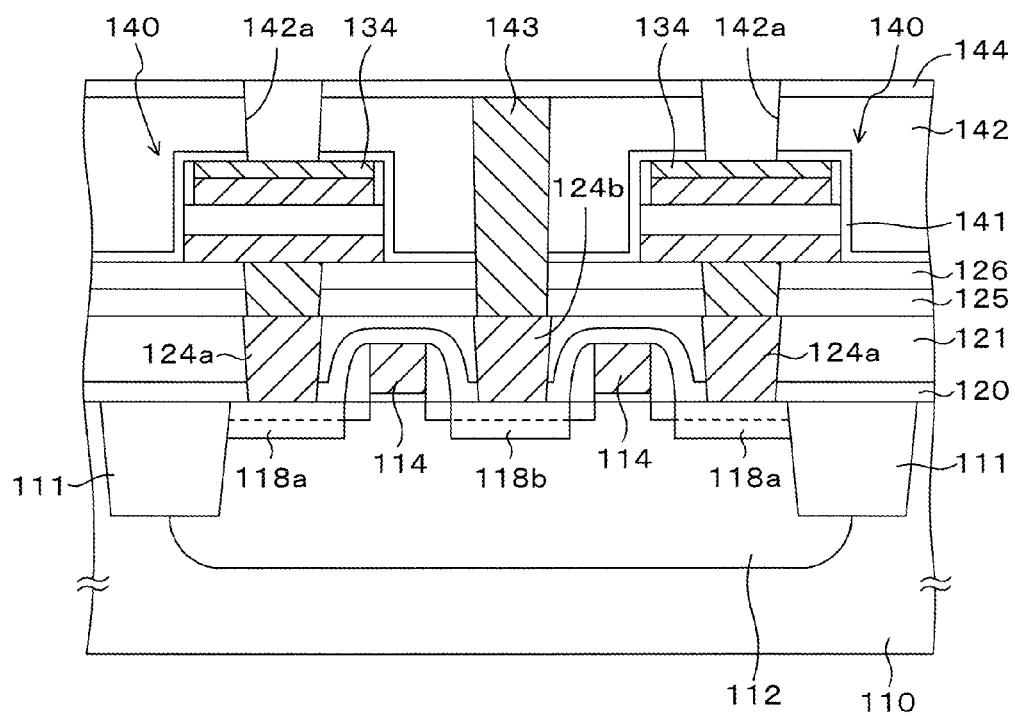
Figure 3S:
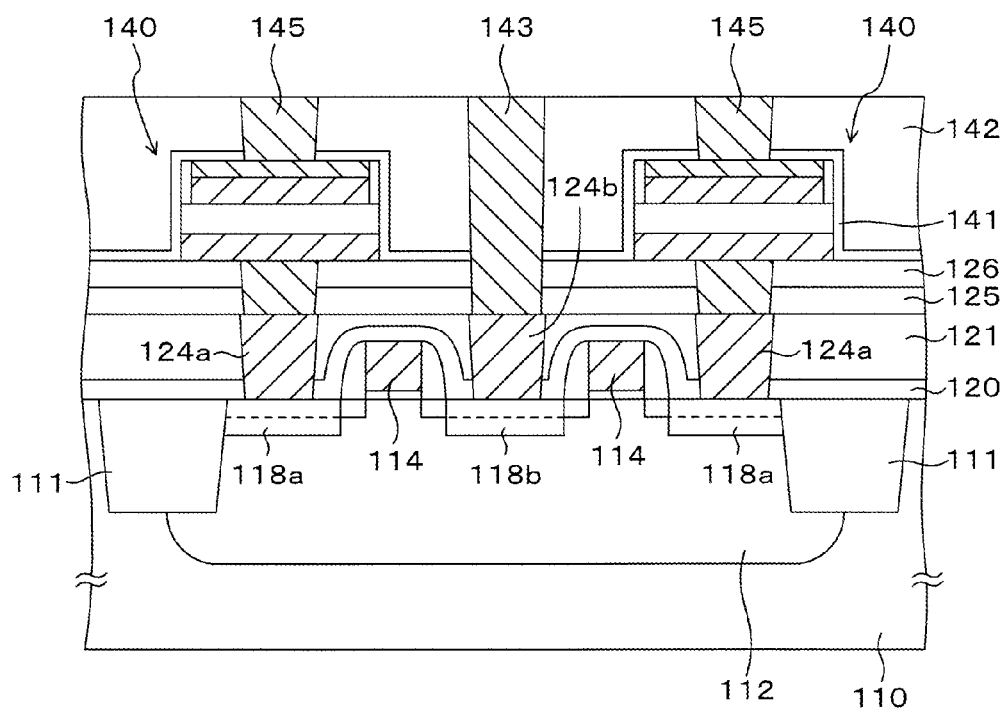
Figure 3T:
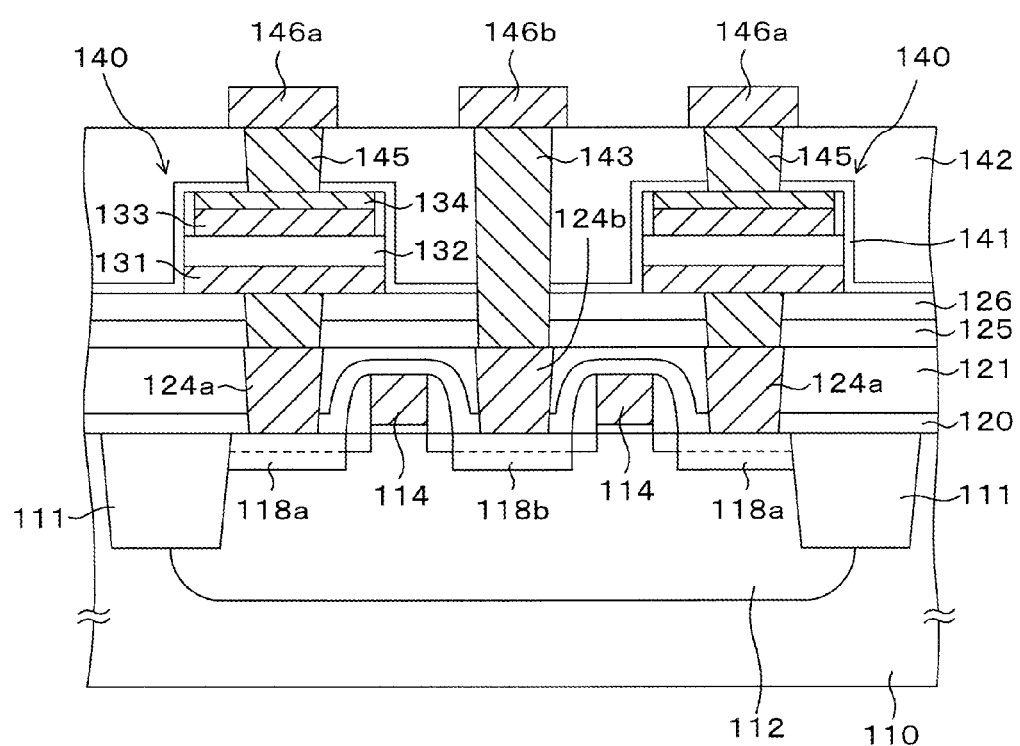

FIGS. 3A to 3T are sectional views depicting, in a process sequence, a method of manufacturing a semiconductor device (FeRAM) including a ferroelectric capacitor according to a first embodiment. Although, in general, an n-type transistor and a p-type transistor which constitute a drive circuit (a write circuit and a read circuit) are formed on a semiconductor substrate together with a memory cell, diagrammatic representations of the transistors are omitted here.

First, a process until formation of a structure depicted in FIG. 3A is completed is described. As depicted in FIG. 3A, element isolation layers 111 are formed in predetermined regions of a semiconductor substrate (silicon substrate) 110. Specifically, the element isolation layers 111 are made by forming trenches in the predetermined regions of the semiconductor device 110 by the photolithographic method, and embedding an insulating material such as $SiO_2$ or the like in the trenches. Such a method of forming the element isolation layers 111 by the trenches in which the insulating material is embedded is referred to as an STI (Shallow Trench Isolation) method. Instead of the element isolation layers 111 by the STI method, an element isolation layer may be formed by a known LOCOS (Local Oxidation of Silicon) method. Additionally, the semiconductor substrate 110 may be either p-type or n-type.

Next, a p-well 112 is formed by introducing a p-type impurity (boron (B) or the like, for example) into an n-type transistor forming region (a memory cell area and an n-type transistor forming region of a drive circuit: hereinafter same as above) of the semiconductor substrate 110. In addition, an n-well (not depicted) is formed by introducing an n-type impurity (phosphorus (P) or the like, for example) into a p-type transistor forming region (a p-type transistor forming region of the drive circuit: hereinafter same as above) of the semiconductor substrate 110.

Next, gate insulation film 113 is formed by thermally oxidizing surfaces of the p-well 112 and the n-well (not depicted). Then, a polysilicon film is formed on an entire upper surface of the semiconductor substrate 110 by the CVD method, and a gate electrodes 114 are formed by patterning the polysilicon film by the photolithographic method.

Note that it is preferable that gate electrodes into which n-type impurities are introduced are formed above the p-well 112, while gate electrodes into which p-type impurities are introduced are formed above the n-well (not depicted). In addition, as depicted in FIG. 3A, in the memory cell area, two gate electrodes 114 are arranged to be parallel to each other on one p-well 112.

Next, low concentrated n-type impurity regions 116 are formed by ion implanting n-type impurities such as phosphorus (P) or the like at low concentration into the p-well 112 in the n-type transistor forming region, with the gate electrodes 114 as masks. Similar to this, low concentrated p-type impurity regions (not depicted) are formed by ion implanting p-type impurities such as boron (B) or the like at low concentration into the n-well (not depicted) in the p-type transistor forming region, with the gate electrodes 114 as masks.

Next, sidewalls 117 are formed on both sides of the gate electrodes 114. The sidewalls 117 are made by forming an insulation film composed of $SiO_2$ or SiN or the like on the entire upper surface of the semiconductor substrate 110 by the CVD method, then etching back the insulation film, and leaving the insulation film only on the both sides of the gate electrodes 114.

Subsequently, high concentrated n-type impurity regions 118a, 118b are formed by ion implanting n-type impurities at high concentration into the p-well 112 in the n-type transistor forming region, with the gate electrodes 114 and the sidewalls 117 as masks. Note that a high concentrated n-type impurity region 118a is an impurity region formed between the gate electrode 114 and the element isolation layer 111, while a high concentrated n-type impurity region 118b is an impurity region formed between the two gate electrodes 114.

Similar to this, high concentrated p-type impurity regions (not depicted) are formed by ion implanting p-type impurities at high concentration into the n-well (not depicted) in the p-type transistor forming region, with the gate electrodes and sidewalls as masks. In this way, a transistor having a source/drain of an LDD (Lightly Doped Drain) structure is formed in each transistor forming region. The steps up to this point are basically same as the conventional CMOS manufacturing steps.

Additionally, it is preferable that a metal silicide (silicide) layer such as cobalt silicide or titanium silicide is formed as a contact layer on surfaces of the gate electrode 114, the high concentrated n-type impurity regions 118a, 118b and the high concentrated p-type impurity regions.

Next, a process until formation of a structure depicted in FIG. 3B is completed is described. After the n-type transistor and the p-type transistor are made in the above steps, a cover film 120 being 200 nm thick and composed of SiON, for example, is formed on the entire upper surface of the semiconductor substrate 110 by the plasma CVD method. Furthermore, for example, a $SiO_2$ film (TEOS-NSG (Tetra-Ethyl-Ortho-Silicate-Nondoped Silicate Glass) film) being 600 nm thick is formed as an insulation film 121 on the cover film 120. Subsequently, the surface of the insulation film 121 is polished approximately 200 nm deep by the CMP (Chemical Mechanical Polishing) method and smoothed. Then, as degassing process, an annealing process is performed at temperatures of 650° C. in an $N_2$ atmosphere for 30 minutes.

A process until formation of a structure depicted in FIG. 3C is completed is described hereinafter. After the insulation film 121 is formed and subjected to the degassing process in the steps described above, photoresist is applied to the insulation film 121 to form a photoresist film 122. Then, exposure and development processes are performed to form openings 122a to which the insulation film 121 is exposed at predetermined positions. Next, the insulation film 121 and the cover film 120 are etched with the photoresist film 122 as a mask, and contact holes 121a are formed. The contact holes 121a run from the surface of the insulation film 121 to the high concentrated n-type impurity regions 118a, 118b in the n-type transistor forming region and the high concentrated p-type impurity regions (not depicted) in the p-type transistor forming region. Then, the photoresist film 122 is removed.

Next, a process until formation of a structure depicted in FIG. 3D is completed is described. After the contact holes 121a are formed in the steps described above, barrier metal (not depicted) is formed on the entire upper surface of the semiconductor substrate 110 by the PVD (Physical Vapor Deposition) method. With this, wall surfaces of the contact holes 121a are covered with the barrier metal. Note that the barrier metal is formed by laminating a Ti film of 20 nm thick and a TiN film of 50 nm thick, for example.

Subsequently, not only a W (tungsten) film (not depicted) of 500 nm thick is formed on the entire upper surface of the semiconductor substrate 110 by the CVD method, but also the contact holes 121a are filled with W. Then, the W film and the barrier metal on the insulation film 121 are removed by the CMP method. With this, W remains only in the contact holes 121a, and thus conductive W plugs 124a, 124b are formed. Now, the W plug 124a is a plug connected to the high concentrated n-type impurity region 118a, while the W plug 124b is a plug connected to the high concentrated n-type impurity region 118b.

A process until formation of a structure depicted in FIG. 3F is completed is described hereinafter. After the W plugs 124a, 124b are formed in the steps described above, an oxidation-resistant film 125 composed of SiON and being 100 nm thick is formed on the entire upper surface of the semiconductor substrate 110 by the plasma CVD method, for example. The oxidation-resistant film 125 is formed to prevent the W plugs 124a, 124b from oxidizing. Then, an $SiO_2$ film (TEOS-NSG film) 126 of 100 nm thick is formed on the oxidation-resistant film 125 by the plasma CVD method, for example. In the embodiment, the insulation film formed by laminating the $SiO_2$ film 126, the oxidation-resistant film 125, and the insulation film 121 is referred to as a first interlayer insulation film. Moreover, in order to reliably prevent oxidation of the W plugs 124a, 124b, a SiON film of 30 to 50 nm thick or an AlO (aluminum oxide) film of 10 to 20 nm thick may be formed on the $SiO_2$ film 126.

Figure 9:
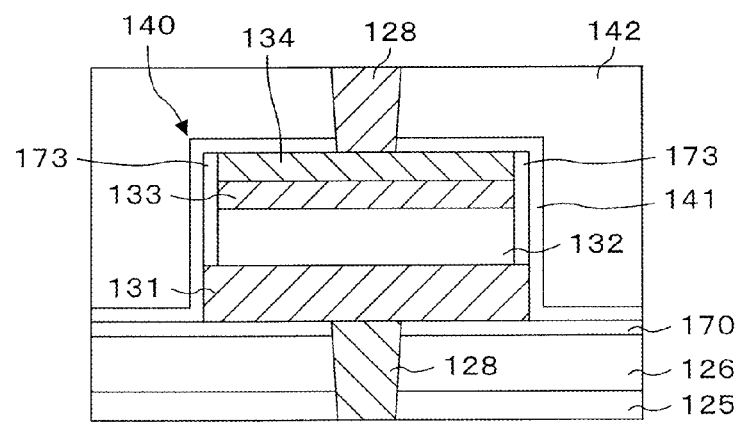
FIG. 9 is a schematic view depicting a structure of a semiconductor device according to a third modification.

Next, a process until formation of a structure as depicted in FIG. 9 is completed is described. After the $SiO_2$ film 126 is formed in the steps described above, photoresist is applied onto the $SiO_2$ film 126 to form a photoresist film 127. Then, exposure and development processes are performed and openings 127a to which the $SiO_2$ film 126 is exposed are formed at predetermined regions. Then, the $SiO_2$ film 126 and the oxidation-resistant film 125 are etched with the photoresist film 127 as masks, and contact holes 125a running from the surface of the $SiO_2$ film 126 to the W plugs 124a are formed. Then, the photoresist film 127 is removed.

Next, a process until formation of a structure as depicted in FIG. 3G is completed is described. After the contact holes 125a are formed in the steps described above, barrier metal (not depicted) is formed on the entire upper surface of the semiconductor substrate 110 by the PVD method, for example. With this, wall surfaces of the contact holes 125a are covered with the barrier metal. Then, a W film (not depicted) of 500 nm thick is formed on the $SiO_2$ film 126 by the CVD method, and the contact holes 125a are filled with W. Then, the W film and the barrier metal on the $SiO_2$ film 126 are removed by the CMP method. With this, W remains only in the contact holes 125a, and thus conductive W plugs 128 are formed. Subsequently, plasma annealing is performed in a nitrogen atmosphere, and thereby the surface of the $SiO_2$ film 126 is nitrided.

Next, a process until formation of a structure depicted in FIG. 3H is completed is described. After the W plugs 128 are formed in the steps described above, a Ti film of 20 nm thick and a TiAlN film of 100 nm thick (neither is depicted) are formed on the entire upper surface of the semiconductor substrate 110 by the PVD method. Then, as a lower electrode film 131, an Ir film, for example, of 100 nm thick is formed on the entire upper surface of the semiconductor substrate 110.

Next, a ferroelectric film 132 composed of PZT and being 120 nm thick, for example, is formed on the lower electrode film 131 by an MOCVD (Metal Organic Chemical Vapor Deposition) method. The ferroelectric film 132 may be formed of any ferroelectric material other than PZT, for example, PLZT, BLT, SBT or SBTN or the like. Moreover, the ferroelectric film 132 may be formed by any method other than the MOCVD method, for example, a sputtering method, a sol-gel process, or the CVD method.

Then, as an upper electrode film 133, an $IrO_2$ film of 150 nm thick, for example, is formed on the ferroelectric film 132 by a PVD method. The upper electrode film 133 may be formed of any electrical conducting material other than $IrO_2$, for example, metal film such as Pt, Ir, Ru, Rh, Re, Os and Pd or an oxide film of the metals. Alternatively, the upper electrode film 133 may be made by laminating 2 or more films thereof.

Next, the ferroelectric film 132 is crystallized. The crystallization of the ferroelectric film 132 is performed by subjecting the ferroelectric film to first RTA (Rapid Thermal Annealing) process in mixed gas of Ar (Argon) and $O_2$, for example, under the conditions that substrate temperature is 725° C. and processing time is 60 seconds, and then to second RTA process in an oxygen atmosphere under the conditions that the substrate temperature is 750° C. and the processing time is 60 seconds.

Next, a process until formation of a structure depicted in FIG. 3I is completed is described. After the ferroelectric film 132 is crystallized in the steps described above, a Pt film of 100 nm thick, for example, is formed on the upper electrode film 133 as a cap layer by the PVD method. The Pt film 134 may replace an Ir film, as a cap layer. Additionally, the cap layer is not essential in the embodiments, and thus formation of the cap layer may be omitted.

Subsequently, a TiN film 135 of 200 nm thick, for example, is formed on the Pt film 134 by the PVD method. Furthermore, the $SiO_2$ film (TEOS-NSG film) 136 of 700 nm thick, for example, is formed on the TiN film 135 by the plasma CVD method.

Next, a process until formation of a structure depicted in FIG. 3J is completed is described. After the $SiO_2$ film 136 is formed in the steps described above, photoresist is applied to the $SiO_2$ film to form a photoresist film 137. Then, the photoresist film 137 is subjected to exposure and development processes, thus leaving the photoresist film 137 only on the $SiO_2$ film 136 above the W plugs 124a.

Next, a process until formation of a structure depicted in FIG. 3K is completed is described. After the photoresist film 137 is formed on a predetermined region of the $SiO_2$ film 136 in the steps described above, the $SiO_2$ film 136 and the TiN film 135 are etched with the photoresist film 137 as a mask. The etching of the $SiO_2$ film 136 is performed by the dry etching method and mixed gas of $C_4F_8$, Ar, and $CF_4$, for example, is used as etching gas. The etching of the TiN film is also performed by the dry etching method, and mixed gas of $BCL_3$ and $Cl_2$, for example, or $Cl_2$ gas is used as etching gas. Subsequently, the photoresist film 137 used as the etching mask is removed by asking. In this way, a hard mask composed of the TiN film 135 and the $SiO_2$ film 136 is formed.

Next, a process until formation of a structure depicted in FIG. 3L is completed is described. After the hard mask of a predetermined pattern is formed in the steps described above, the Pt film 134 and the upper electrode film 133 are etched. More specifically, using an ICP (Inductive Coupling Plasma) type etching apparatus, the upper electrode film 133 is etched by allowing HBr gas at the flow rate of 10 sccm (standard cc/min) and $O_2$ gas at flow rate of 40 sccm flow into a chamber, and by setting pressure inside the chamber to 0.4 Pa, wafer stage temperature to 400° C., source power to 800 W (watts), and bias power to 700 W. Note that the source power is high-frequency power supplied to an antenna of the ICP type etching apparatus, and the bias power is high-frequency power supplied to the semiconductor substrate 110. End of the etching is detected by an EPD (End Point Detector). In this case, it is preferable to perform etching under conditions which lead to somewhat overetching. In addition, in the etching step, the ferroelectric film 132 may be etched halfway in a thickness direction by changing the etching conditions.

Next a process until formation of a structure depicted in FIG. 3M is completed is described. After the upper electrode film 133 is patterned in the steps described above, an insulating protective film 138 composed of SiN, $Al_2O_3$, $Ta_2O_5$ or SiC, for example, and being 5 to 20 nm thick is formed on the entire upper surface of the semiconductor substrate 110 by the thermal CVD method or an ALD (Atomic Layer Deposition) method. With this, side surfaces of the hard mask ($SiO_2$ film 136 and the TiN film 135), the Pt film 134, and the upper electrode film 133 are covered with the insulating protective film 138. Here, as the insulating protective film 138, an $Al_2O_3$ film is formed by the ALD method. In this case, since gas which contains hydrogen, such as trimethyl aluminum or the like, is used, properties of the ferroelectric film 132 may deteriorate due to hydrogen when temperature in film formation exceeds 300° C. Accordingly, it is preferable that the temperature in film formation of the insulating protective film 138 is less than 300° C. (250° C., for example).

Additionally, when thickness of the insulating protective film 138 is less than 5 nm, not only it is difficult to uniformly form the insulating protective film 138, but also it is likely that the insulating protective film 138 is delaminated when the ferroelectric film 132 and the lower electrode film 131 are etched in a post-process, and conductive particles adhere to the side surface of the upper electrode film 133, thus causing a short. In contrast, when thickness of the insulating protective film 138 exceeds 20 nm, high integration of a semiconductor device is hindered. Consequently, it is preferable that thickness of the insulating protective film 138 is made to be 5 to 20 nm.

Next, a process until formation of a structure depicted in FIG. 3N is completed is described. After the insulating protective film 138 is formed in the steps described above, the insulating protective film 138 on the ferroelectric film 132, the ferroelectric film 132, and the lower electrode film 131 are etched. When the insulating protective film 138 and the ferroelectric film 132 are etched, $Cl_2$ gas and Ar gas are introduced into the chamber, and pressure in the chamber is set to 0.4 Pa, temperatures of the wafer stage to 400° C., source power to 800 W, and bias power to 700 W. The flow rate of the $Cl_2$ gas is 40 sccm, for example, and the flow rate of the Ar gas is 10 sccm, for example. In addition, when the lower electrode film 131 is etched, HBr gas, $O_2$ gas, and $C_4F_8$ gas are introduced into the chamber, and pressure in the chamber is set to 0.4 Pa, source power to 100 W, and bias power to 500 W. The flow rate of HBr gas is 10 sccm, for example, the flow rate of $O_2$ gas is 40 sccm, for example, and flow rate of $C_4F_8$ gas is 5 sccm, for example.

In the etching steps, since the side surface of the upper electrode film 133 is protected by the insulating protective film 138, no conductive particle is generated from the upper electrode film 133. In addition, even if conductive particles are generated because of etching of the lower electrode film 131, no short may occur between the lower electrode film 131 and the upper electrode film 133 because the side surface of the upper electrode film 133 is covered with the insulating protective film 138. Note that, if etching is performed under the conditions described above, it is possible that the insulating protective film 138 adhered to the upper part of the side surface of the hard mask may be etched. However, there is no problem if the insulating protective film 138 adhered to the side surface of the upper electrode film 133 is not removed.

Next, a process until formation of a structure depicted in FIG. 3O is completed is described. After the ferroelectric film 132 and the lower electrode film 131 are patterned in the steps described above, the $SiO_2$ film 136 and the TiN film 135 which remain as the hard mask are removed by etching. The $SiO_2$ film 136 is removed by reactive etching (RIE) using $C_4F_8$ gas, Ar gas, and $CF_4$ gas, for example. Moreover, the TiN film 135 is removed by wet etching using a mixture of $NH_4OH$, $H_2O_2$, and $H_2O$, for example. In this way, the ferroelectric capacitor 140 composed of the lower electrode film 131, the ferroelectric film 132, and the upper electrode film 133 is formed.

Figure 4:
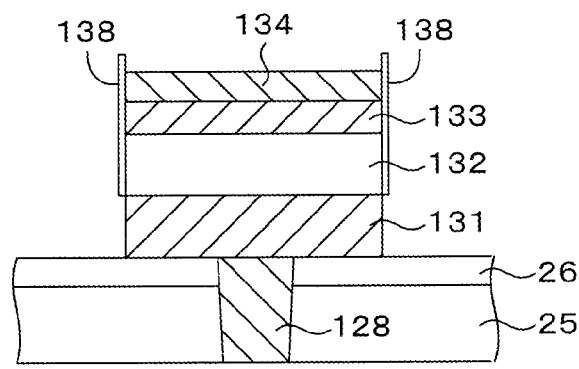
FIG. 4 is a sectional view depicting an insulating protective film that remains after removal of a hard mask and projects upward, in the step depicted in FIG. 3O.

It is also possible that the insulating protective film 138 protrudes above the edge of the Pt film 134, when the hard mask (the $SiO_2$ film 136 and the TiN film 135) is removed, as depicted in FIG. 4. Although protrusion of the insulating protective film 138 above the edge of the Pt film 134 is not a problem in particular, a step of removing the protrusions by etching with use of Ar gas may be added.

Next, a process until formation of a structure depicted in FIG. 3P is completed is described. After the hard mask is removed in the steps described above, a recovery anneal is performed to recover the ferroelectric film 132 from any damage due to etching. Here, as the recovery anneal, heat treatment is performed in an oxygen atmosphere under the conditions that the substrate temperature is 650° C. for 60 minutes.

Subsequently, as a capacitor protective film 141, an alumina (aluminum oxide) film of 50 nm thick, for example, is formed on the entire upper surface of the semiconductor substrate 110 by the MOCVD method. The capacitor protective film 141 has a function to prevent entry of hydrogen and moisture into the ferroelectric film 132. This prevents deterioration of the properties of the ferroelectric film 132.

Next, a second interlayer insulation film 142 of 1500 nm thick, for example, is formed by accumulating $SiO_2$ (TEOS-NSG) on the capacitor protective film 141 by the plasma CVD method. Then, a surface of the second interlayer insulation film 142 is polished and smoothed by the CMP method.

Next, a process until formation of a structure depicted in FIG. 3Q is completed is described. After the second interlayer insulation film 142 is formed in the steps described above, contact holes running from the surface of the interlayer insulation film 142 to the W plug 124b is formed by the photoresist technique and the etching method. Then, after wall surfaces of the contact holes are covered with barrier metal (not depicted), a W film (not depicted) is formed on the interlayer insulation film 142, and the contact holes are filled with W. Subsequently, the W film on the interlayer insulation film 142 and the barrier metal are removed by the CMP method, thus leaving W in the contact holes only. With this, conductive W plugs 143 are formed. Then, as an oxidation-resistant film 144, an SiON film of 100 nm thick, for example, is formed on the interlayer insulation film 142 and the W plugs 143 by the plasma CVD method.

Next, a process until formation of a structure depicted in FIG. 3R is completed is described. After the oxidation-resistant film 144 is formed in the steps described above, a photoresist film (not depicted) is formed on the oxidation-resistant film 144. Then, the photoresist film is subjected to exposure and development processes, openings to which the oxidation-resistant film 144 is exposed are formed above the ferroelectric capacitors 140. Then, the oxidation-resistant film 144, the interlayer insulation film 142, and the capacitor protective film 141 are etched with the photoresist film as a mask, thus forming contact holes 142a running from the surface of the oxidation-resistant film 144 to the Pt film 134.

Then, as a recovery anneal, thermal processing in an oxygen atmosphere at temperatures of 500° C. for 60 minutes is performed.

Next, a process until formation of a structure depicted in FIG. 3S is completed is described. After the contact holes 142a are formed in the steps described above, the oxidation-resistant film 144 is removed by dry etching. Then, a barrier metal (not depicted) is formed on the entire upper surface of the semiconductor substrate 110 by the PVD method, and wall surfaces of the contact holes 142a are covered with the barrier metal. Subsequently, a W film (not depicted) of 500 nm thick, for example, is formed on the interlayer insulation film 142 by the CVD method, and the contact holes 142a are filled with W. Then, the W film and the barrier metal on the interlayer insulation film 142 are removed by the CMP method. With this, W remains only in the contact holes 142a, and thus conductive W plugs 145 are formed.

Next, a process until formation of a structure depicted in FIG. 3T is completed is described. After the W plugs 145 are formed in the steps described above, a conductive film is formed by sequentially laminating a TiN film of 150 nm thick, an Al—Cu film of 550 nm thick, a Ti film of 5 nm thick, and a TiN film of 150 nm thick on the interlayer insulation film 142 and the W plug 145. Then, the conductive film is patterned by the photolithography method and the etching method, thus forming wiring 146a, 146b. Here, the wiring 146a is wiring connected to the upper electrode film 133 of the ferroelectric capacitor 140 by way of the W plugs 145 and the Pt film 134, while the wiring 146b is wiring connected to the high concentrated n-type impurity region 118b by way of the W plug 143 and the W plug 124b. In this way, a semiconductor device (FeRAM) including the ferroelectric capacitor 140 is completed.

In the semiconductor device manufactured in this way, the gate electrodes 114 of the transistors in the memory cell region constitute a part of a word line, while the wiring 146b connected to the high concentrated n-type impurity region 118b, which is common to the transistors, constitute a part of a bit line.

In the embodiment, since the side surface of the upper electrode film 133 is coated by forming the insulating protective film 138 on the entire surface after patterning the upper electrode film 133, a short between the lower electrode film 131 and the upper electrode film 133 can be reliably prevented even if conductive particles are generated in the subsequent step of patterning the ferroelectric film 132 and the lower electrode film 131. In addition, since the insulating protective film 138 may be formed as thin as 5 to 20 nm, by the CVD method or the ALD method, high integration of a semiconductor device is possible. Furthermore, deterioration of the properties of the ferroelectric film 132 due to hydrogen gas can be prevented through film formation of the insulating protective film 138 at temperatures less than 300° C. (250° C.). Consequently, with the embodiment, a semiconductor device (FeRAM) having good properties can be manufactured.

Additionally, in the embodiment, the insulating protective film 138 can be formed by the ALD method, the thermal CVD method or the unbiased plasma CVD method or the like. In this case, it is preferable that the temperatures in film formation are less than 300° C.

Alternatively, the insulating protective film 138 may have a laminated structure. For example, a lower layer film may be formed by the sputtering method from which no hydrogen gas is generated, and an upper layer film may be formed by the plasma CVD method or the thermal CVD method. Since the sputtering method does not generate any hydrogen gas, it is less likely that it deteriorates the ferroelectric film 132. However, the sputtering method does not provide good step coverage, it is not preferable to form a single layer insulating protective film 138 by the sputtering method. As described above, through formation of the insulating protective film 138 of laminated structure by combining the sputtering method and the CVD method, deterioration of the ferroelectric film 132 can be prevented, and the side surface of the upper electrode film 133 can be reliably covered.

When the insulating protective film 138 has a laminated structure, it is preferable to construct lower layer by a film having high barrier properties to hydrogen or moisture, such as an SiN film, an $Al_2O_3$ film, a $Ta_2O_5$ film or the like. Additionally, since for a $TiO_2$ film, Ti is diffused in PZT and deteriorates the properties of PZT, it is not preferable to construct the lower layer film by $TiO_2$. Moreover, it is preferable to form the lower layer film at temperature of less than 300° C. by the thermal CVD method or the ALD method.

An upper layer film can be formed by the plasma CVD method, thermal CVD method or the ALD method. In this case, the temperature in film formation may exceed 300° C. It is also preferable to construct the upper layer film of a film having high barrier properties to hydrogen or moisture, such as an SiN film, an $Al_2O_3$ film, a $Ta_2O_5$ film or the like. However, if the lower layer film is constructed of the film having high barrier properties to hydrogen or moisture, the upper layer film may be constructed of $SiO_2$ or other film having low barrier properties. Alternatively, the upper layer film may be formed of a material containing a constituent substance of PZT, such as $TiO_2$.

Second Embodiment

FIGS. 5A to 5G are sectional views depicting a method of manufacturing a semiconductor device (FeRAM) according to a second embodiment. In FIGS. 5A to 5G, the same or similar reference numeral is given to the same or similar part in FIGS. 3A to 3T.

Figure 5A:
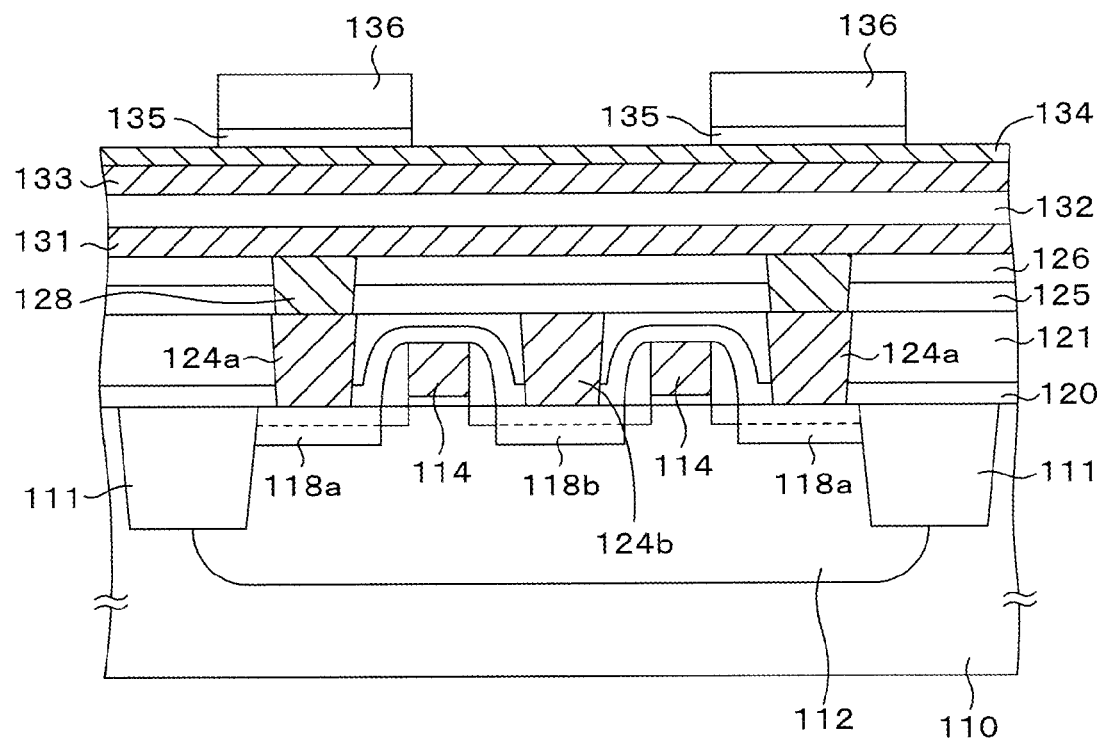
FIGS. 5A to 5G are sectional views depicting a method of manufacturing a semiconductor device according to a second embodiment.

First, as depicted in FIG. 5A, with a method similar to the first embodiment, a transistor, a cover film 120, an insulation film 121, W plugs 124a, 124b, an oxidation-resistant film 125, an $SiO_2$ film 126, a W plug 128, a lower electrode film 131, a ferroelectric film 132, an upper electrode film 133, and a Pt film 134 are formed on a semiconductor substrate 110, and a TiN film 135 and an $SiO_2$ film 136 are formed on the Pt film 134. Then, the $SiO_2$ film 136 and the TiN film 135 are patterned by the photolithography method, thus forming a hard mask of a predetermined shape.

Figure 5B:
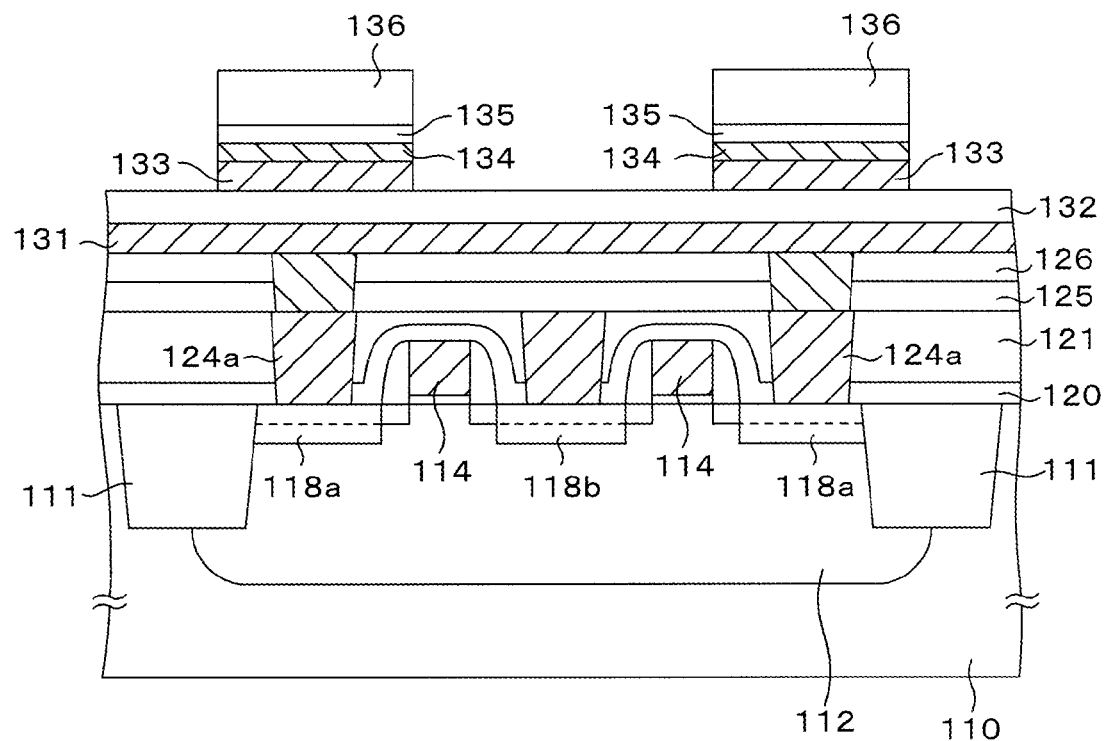

Next, using the hard mask (the $SiO_2$ film 136 and the TiN film 135), the Pt film 134 and the upper electrode film 133 are etched, as depicted in FIG. 5B. An ICP type etching apparatus is used for etching of the Pt film 134 and the upper electrode film 133. HBr gas and $O_2$ gas are used as etching gas, and etching is performed under the conditions that temperature of a wafer stage is 400° C., source power is 800 W, and bias power is 700 W. End of the etching is detected by an EPD (End Point Detector).

Figure 5C:
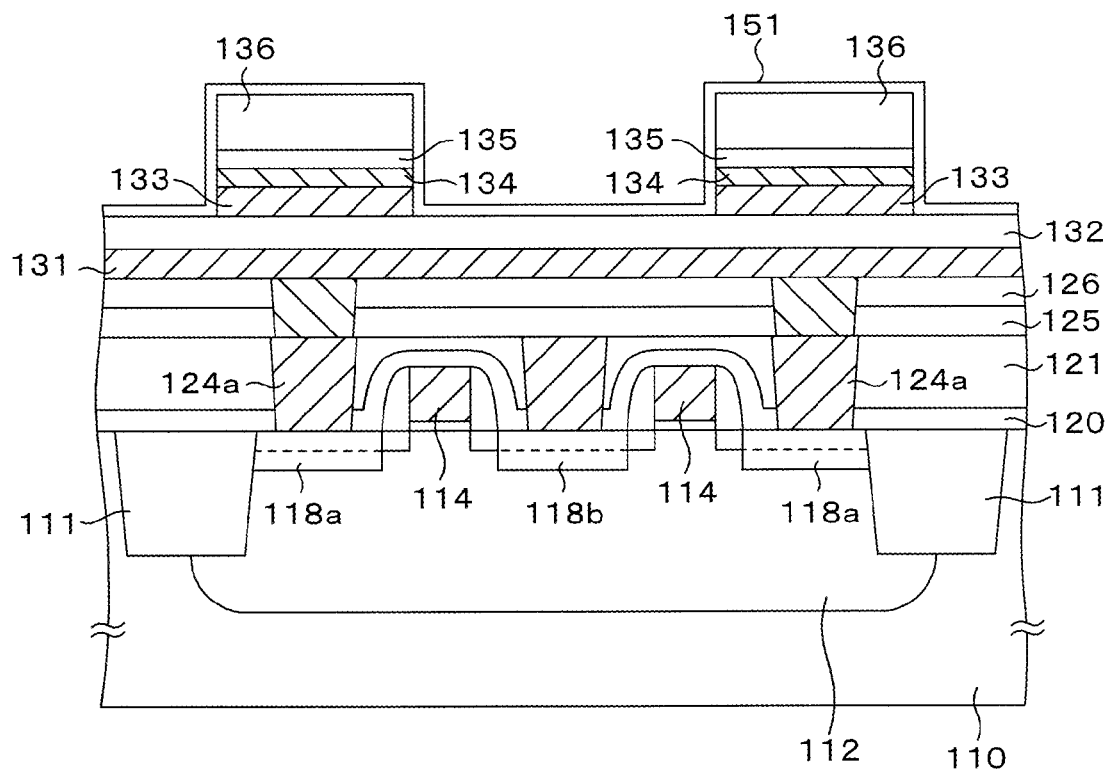

Next, as depicted in FIG. 5C, a first insulating protective film 151 composed of SiN, $Al_2O_3$, $Ta_2O_5$ or SiC, for example, and being 5 to 20 nm thick is formed on an entire upper surface of a semiconductor substrate 110. With this, side surfaces of the hard mask (the $SiO_2$ film 136 and the TiN film 135), the Pt film 134, and the upper electrode film 133 are covered with the insulating protective film 151. Note that it is preferable that temperature in film formation of the insulating protective film 151 is less than 300° C.

Figure 5D:
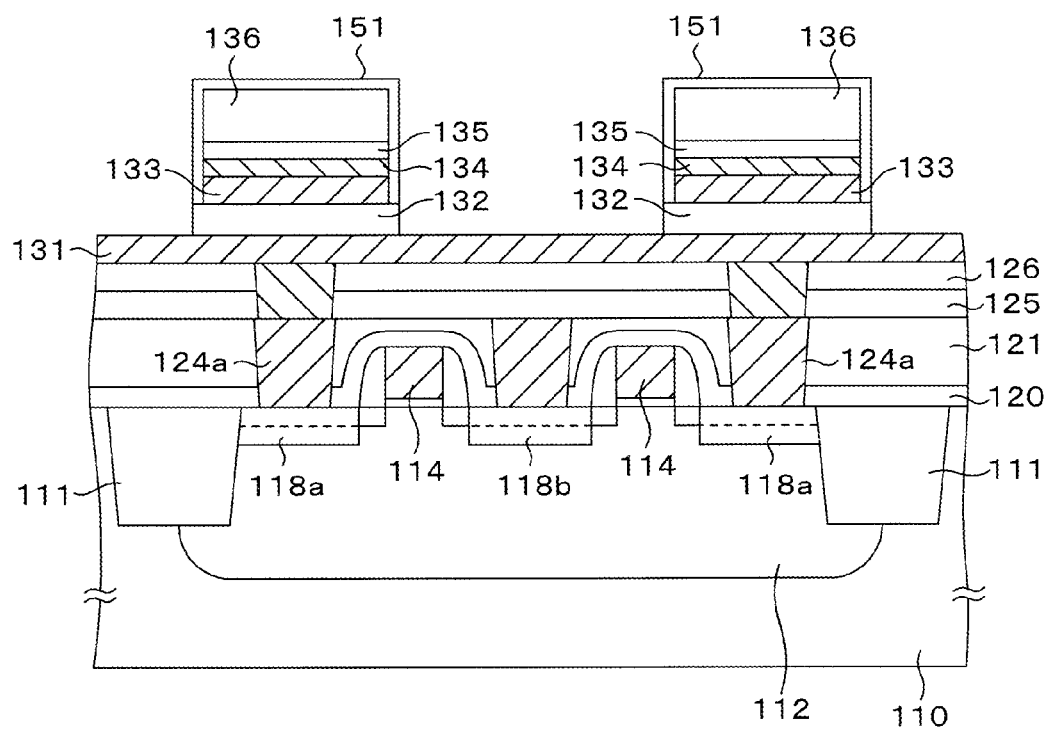

Next, as depicted in FIG. 5D, the ferroelectric film 132 is etched. The ICP type etching apparatus is used for etching of the ferroelectric film 132. Then, using $Cl_2$ gas and Ar gas as etching gas, etching is performed under the conditions that the wafer stage temperature is 400° C., pressure inside a chamber is 0.4 Pa, source power is 800 W, and bias power is 700 W. Although it is possible that, with the etching, the insulating protective film 151 adhered to the upper part of the $SiO_2$ film 136 is removed, there is no problem if the insulating protective film 151 on the side surfaces of the upper electrode film 133 and the Pt film 134 is not removed.

Figure 5E:
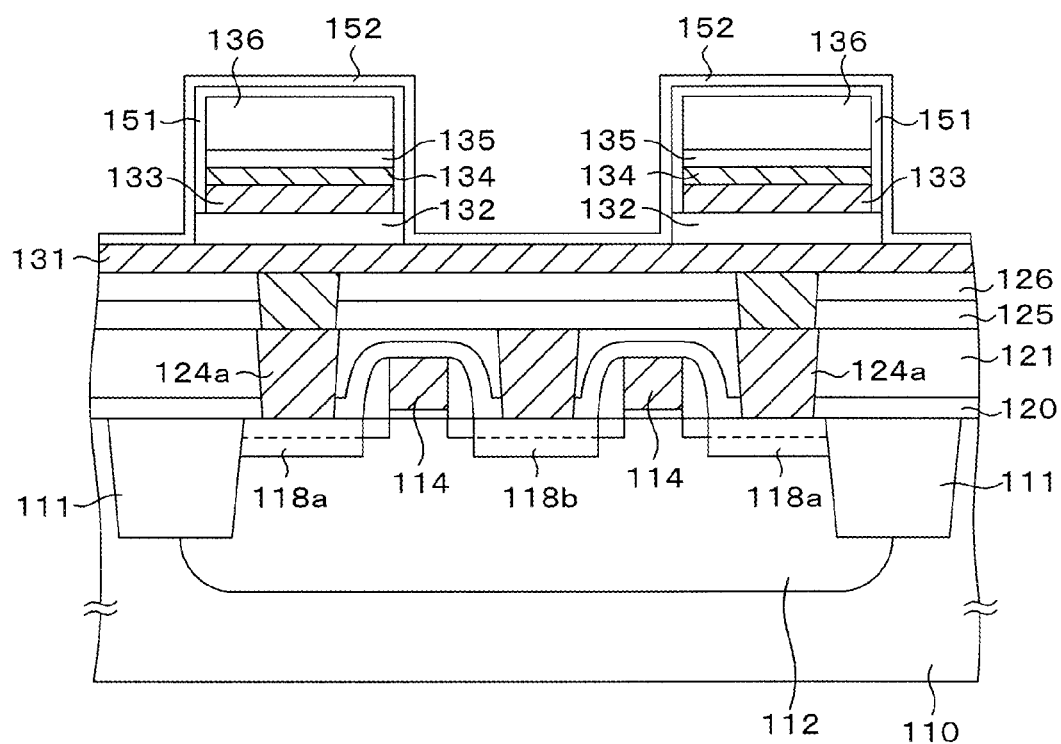

Next, as depicted in FIG. 5E, a second insulating protective film 152 composed of SiN, $Al_2O_3$, $Ta_2O_5$, or SiC, for example, and being 5 to 20 nm thick is formed on the entire upper surface of the semiconductor substrate 110. With this, the side surface of the ferroelectric film 132 is covered with the insulating protective film 152.

Figure 5F:
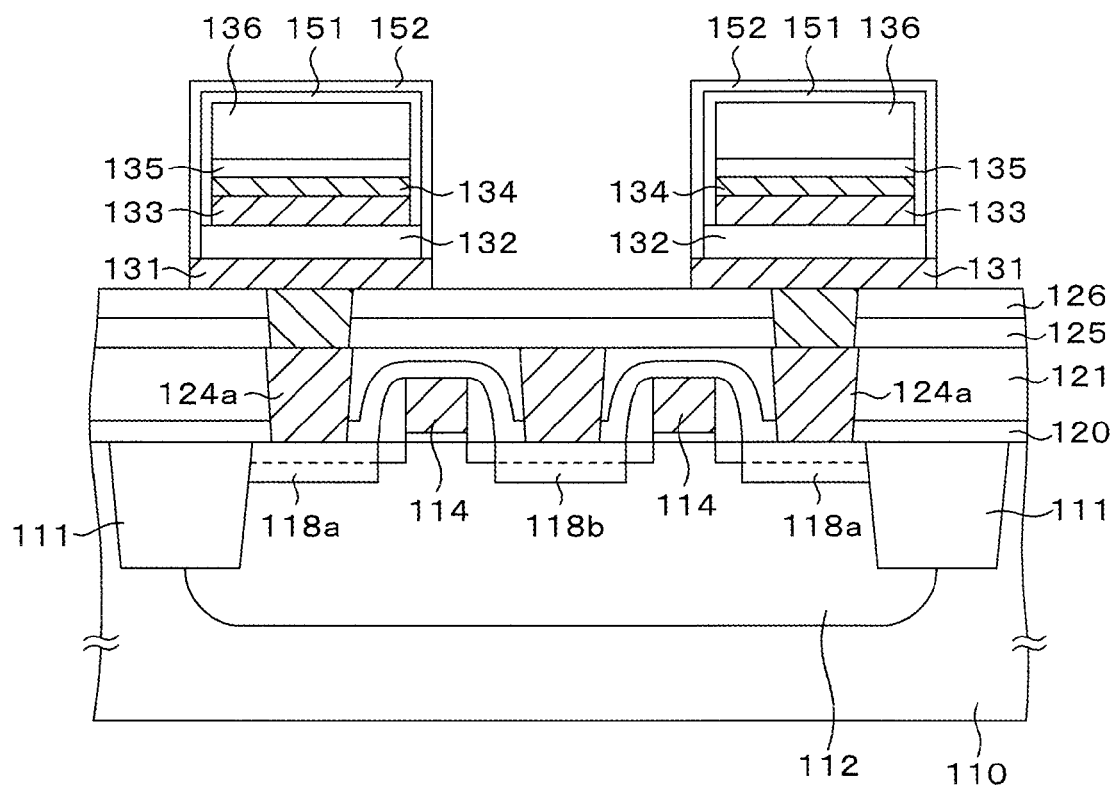

Next, as depicted in FIG. 5F, the lower electrode film 131 is etched. The ICP type etching apparatus is used for etching of the lower electrode film 131. Then, HBr gas, $O_2$ gas, and $C_4F_8$ gas are used as etching gas, and etching is performed under the conditions that the pressure in the chamber is 0.4 Pa, the source power is 100 W, and the bias power is 500 W.

Figure 5G:
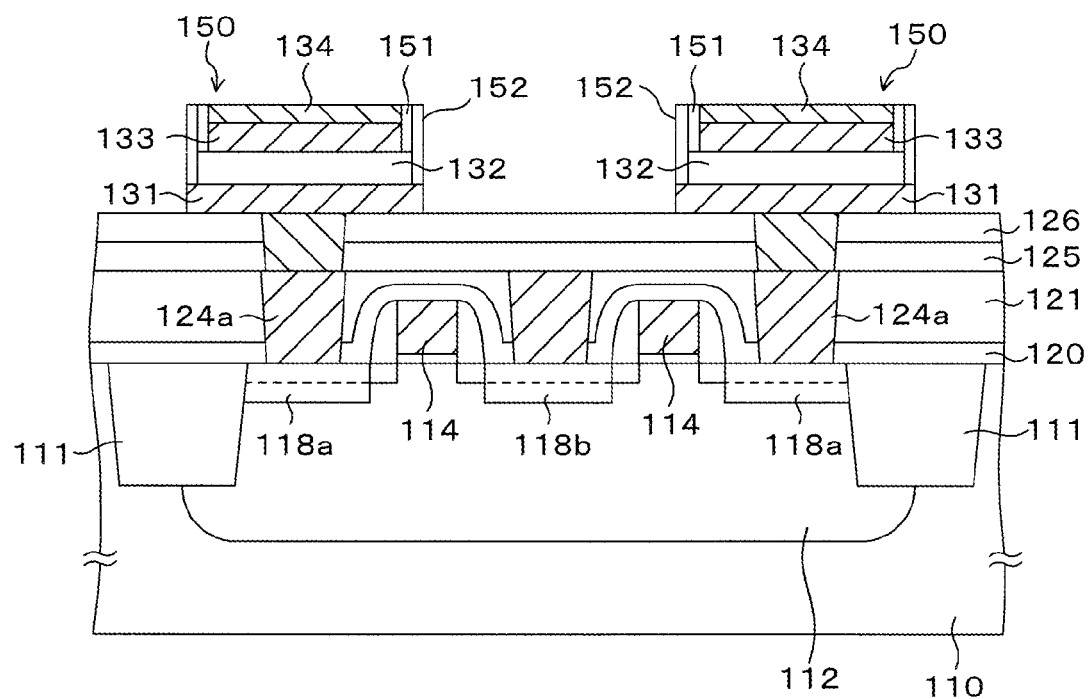

Next, as depicted in FIG. 5G, the TiN film 135, the $SiO_2$ film 136, and the insulating protective films 151, 152 on the Pt film 134 are removed by etching. The insulating protective films 151, 152, and the $SiO_2$ film 136 are removed by reactive etching (RIE) using $C_4F_8$ gas, Ar gas, and $CF_4$ gas, for example. The TiN film 135 is removed by wet etching with use of a mixture of $NH_4OH$, $H_2O_2$, and $H_2O$, for example. In this way, a ferroelectric capacitor 150 composed of the lower electrode film 131, the ferroelectric film 132, and the upper electrode film 133 is formed.

Since subsequent steps are similar to the first embodiment, a description thereof is omitted herein. In the embodiment, since the side surface of the upper electrode film 133 is covered with the insulating protective films 151, 152 when the lower electrode film 131 is etched, effects similar to the first embodiment can be achieved. In addition, in the embodiment, since the side surface of the ferroelectric film 132 is covered with the insulating protective film 152 when the lower electrode film 131 is etched, there is also an advantage that deterioration of the ferroelectric film 132 is even less than in the first embodiment.

In the embodiment, the insulating protective films 151, 152 can be formed by the ALD method, the thermal CVD method, or the unbiased plasma CVD method, or the like. In this case, it is preferable that temperature in film formation is less than 300° C. Moreover, the insulating protective film 152 of the lower layer may be formed by the sputtering method that does not generate hydrogen gas, and the insulating protective film 152 of the upper layer may be formed by the plasma CVD method or the thermal CVD method. Since the sputtering method does not generate hydrogen gas, it is less likely that it deteriorates the ferroelectric film 132. However, the sputtering method does not provide good step coverage. Hence, as described above, through formation of the insulating protective films 151, 152 of a laminated structure by combining the sputtering method and the CVD method, deterioration of the ferroelectric film 132 can be prevented, and the side surface of the upper electrode film 133 can be reliably covered.

It is preferable to construct the insulating protective film 152 of the lower layer with a film having high barrier properties to hydrogen or moisture, such as an SiN film, an $Al_2O_3$ film, a $Ta_2O_5$ film, or the like. Additionally, Ti in the $TiO_2$ film is diffused in PZT and deteriorates the characteristics of PZT, it is not preferable to construct the insulating protective film 151 of the lower layer by $TiO_2$. In addition, it is preferable to form the insulating protective film 151 of the lower layer at temperature less than 300° C. by the thermal CVD method or the ALD method.

The insulating protective film 152 of the upper layer can be formed by the plasma CVD method, the thermal CVD method, or the ALD method. It is also preferable that the insulating protective film 152 of the upper layer is constructed of a film having high barrier properties to hydrogen or moisture, such as an SiN film, an $Al_2O_3$ film, a $Ta_2O_5$ film, or the like.

Third Embodiment

FIGS. 6A to 6E are cross sectional views depicting a method of manufacturing a semiconductor device (FeRAM) according to a third embodiment. In FIGS. 6A to 6E, the same or similar reference numeral is given to the same or similar part in FIGS. 3A to 3T.

Figure 6A:
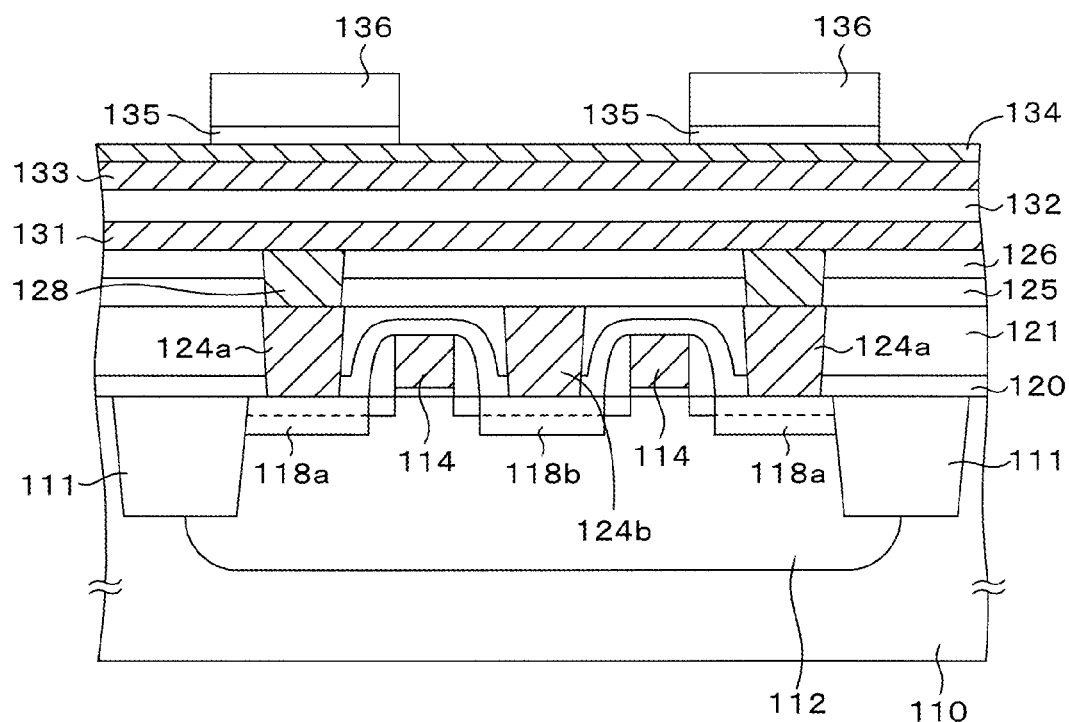
FIGS. 6A to 6E are sectional views depicting a method of manufacturing a semiconductor device according to a third embodiment.

First, as depicted in FIG. 6A, with a method similar to the first embodiment, a transistor, a cover film 120, an insulation film 121, W plugs 124a, 124b, an oxidation-resistant film 125, an $SiO_2$ film 126, a W plug 128, a lower electrode film 131, a ferroelectric film 132, an upper electrode film 133, and a Pt film 134 are formed on a semiconductor substrate 110, and a TiN film 135 and an $SiO_2$ film 136 are formed on the Pt film 134. Then, the $SiO_2$ film 136 and the TiN film 135 are patterned by the photolithography method, thus forming a hard mask of a predetermined shape.

Figure 6B:
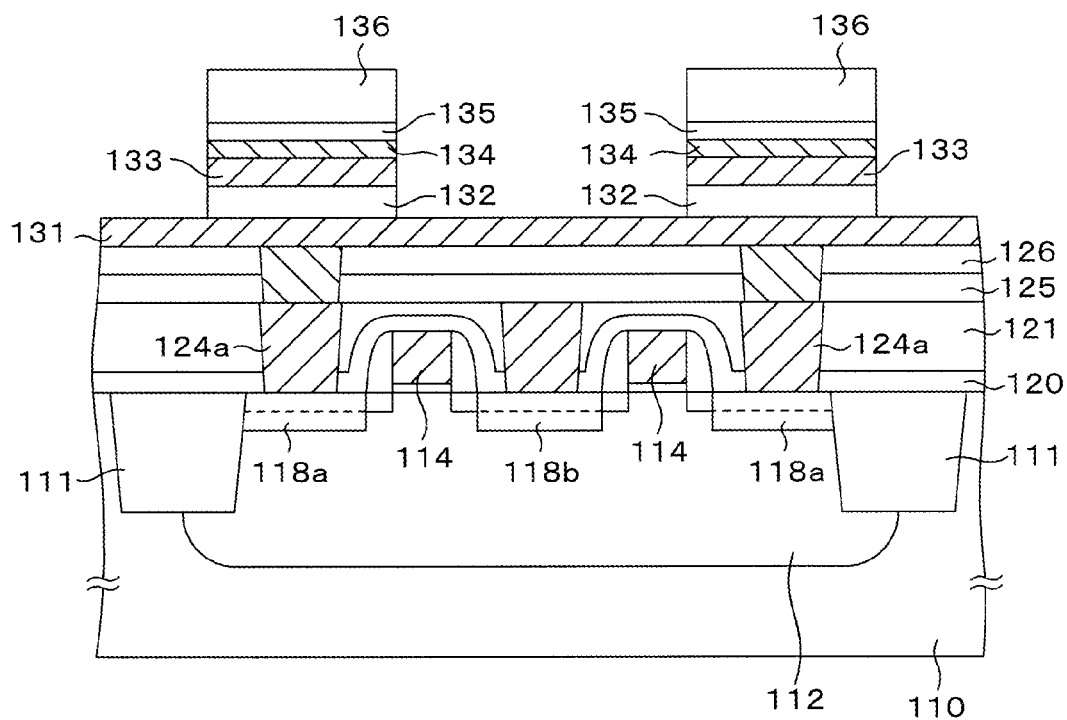

Next, as depicted in FIG. 6B, the Pt film 134, the upper electrode film 133, and the ferroelectric film 132 are etched. An ICP type etching apparatus is used for etching of the Pt film 134, and the upper electrode film 133. Then, HBr gas and $O_2$ gas are used as etching gas, and etching is performed under the conditions that wafer stage temperature is 400° C., source power is 800 W, and bias power is 700° C. End of the etching is detected by an EPD (End Point Detector).

The ICP type etching apparatus is used for etching of the ferroelectric film 132. Then, $Cl_2$ gas and Ar gas are used as etching gas, and etching is performed under the conditions that the pressure in the chamber is 0.4 Pa, the source power is 800 W, and the bias power is 700 W.

Figure 6C:
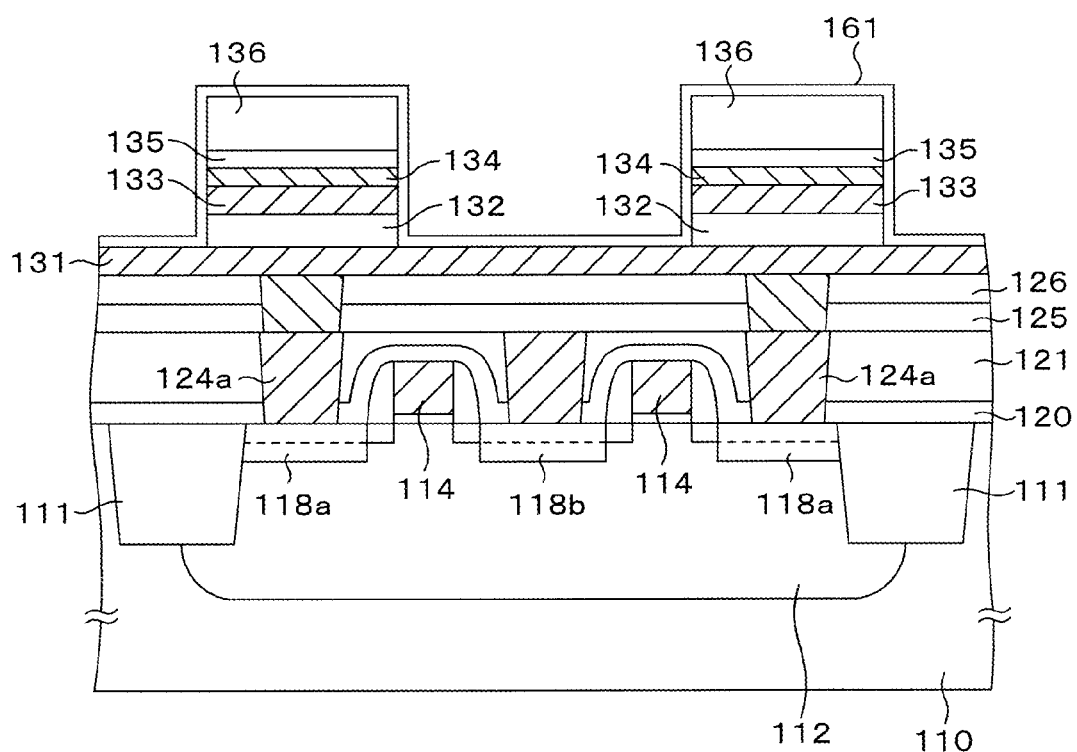

Next, as depicted in FIG. 6C, an insulating protective film 161 composed of SiN, $Al_2O_3$, $Ta_2O_5$ or SiC, for example, and being 5 to 20 nm thick is formed on the entire upper surface of the semiconductor substrate 110. With this, side surfaces of the hard mask (the $SiO_2$ film 136 and the TiN film 135), the Pt film 134, the upper electrode film 133, and the ferroelectric film 132 are covered with the insulating protective film 161. Note that it is preferable that temperature of film formation of the insulating protective film 161 is less than 300° C.

Figure 6D:
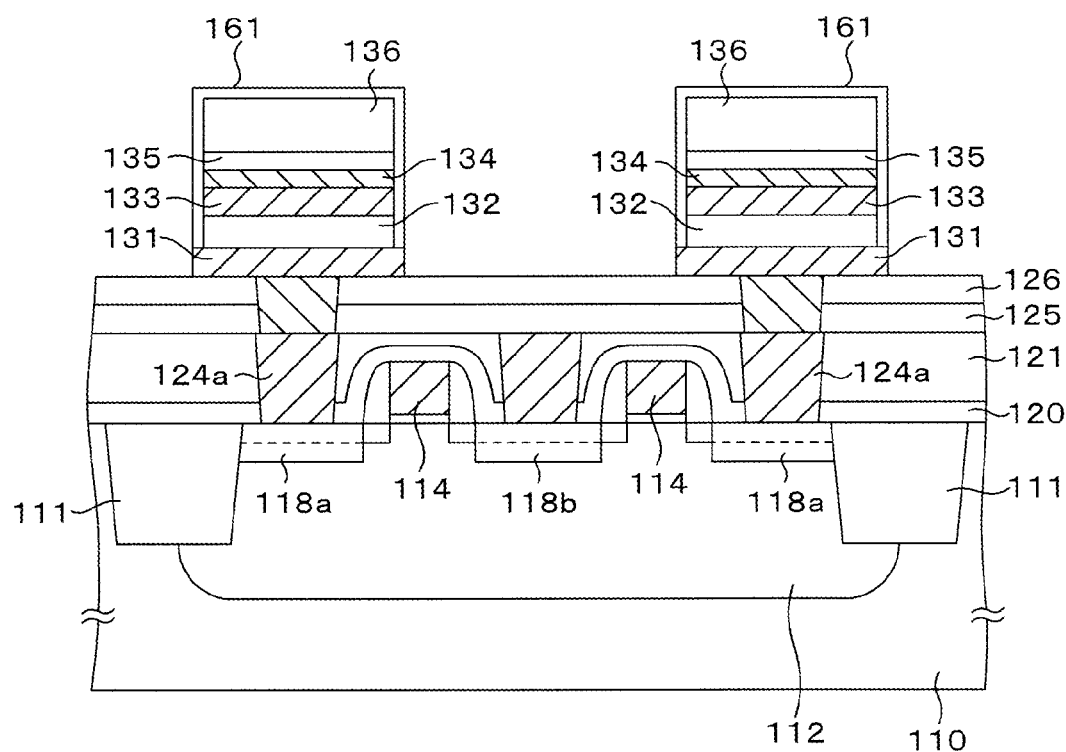

Next, as depicted in FIG. 6D, the lower electrode film 131 is etched. The ICP type etching apparatus is used for etching of the lower electrode film 131. Then, HBr gas, $O_2$ gas, and $C_4F_8$ gas are used as etching gas, and etching is performed under the conditions that the pressure in the chamber is 0.4 Pa, the source power is 1000 W, and the bias power is 500 W.

Figure 6E:
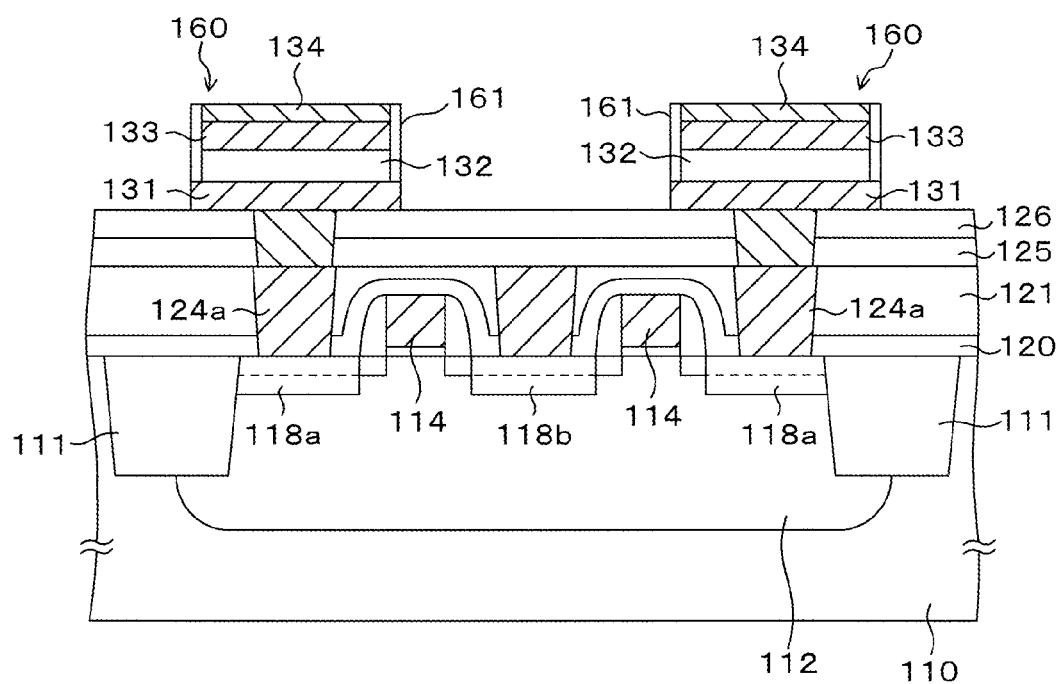

Next, as depicted in FIG. 6E, the TiN film 135, the $SiO_2$ film 136, and the insulating protective film 161 on the Pt film 134 are removed by etching. The insulating protective film 161 and the $SiO_2$ film 136 are removed by reactive etching (RIE) with use of $C_4F_8$ gas, Ar gas, and $CF_4$ gas, for example. The TiN film 135 is removed by wet etching with use of a mixture of $NH_4OH$, $H_2O_2$, and $H_2O$. In this way, a ferroelectric capacitor 160 composed of the lower electrode film 131, the ferroelectric film 132, and the upper electrode film 133 is formed.

Since subsequent steps are similar to the first embodiment, a description thereof is omitted herein. In the embodiment, since the side surface of the upper electrode film 133 is covered with the insulating protective film 161 when the lower electrode film 131 is etched, effects similar to the first embodiment can be achieved.

Note that the insulating protective film 161 can be formed by the ALD method, the thermal CVD method or the unbiased plasma CVD method, or the like. In this case, it is preferable that temperature in film formation is less than 300° C.

Alternatively, the insulating protective film 161 may have a laminated structure. For example, a lower layer film may be formed by the sputtering method that does not generate hydrogen gas and an upper layer film may be formed by the plasma CVD method or the thermal CVD method. Since the sputtering method does not generate hydrogen gas, it is less likely that it deteriorates the ferroelectric film 132. However, since the sputtering method does not provide good step coverage, it is not preferable to form the single layer insulating protective film 161 by the sputtering method. As described above, through formation of the insulating protective film 161 of a laminated structure by combining the sputtering method and the CVD method, deterioration of the ferroelectric film 132 can be prevented, and the side surface of the upper electrode film 133 can be reliably covered.

When the insulating protective film has a laminated structure, it is preferable to construct the lower layer by a film having high barrier properties to hydrogen or moisture, such as an SiN film, an $Al_2O_3$ film, a $Ta_2O_5$ film or the like. Note that, since Ti in the $TiO_2$ film is diffused in PZT and deteriorates properties of PZT, it is not preferable to construct the lower layer film by $TiO_2$. In addition, it is preferable to form the lower layer film at temperature of less than 300° C. by the thermal CVD method or the ALD method.

The upper layer film can be formed by the plasma CVD method, the thermal CVD method or the ALD method. In this case, temperature in film formation may exceed 300° C. It is also preferable to construct the upper layer film of a film having high barrier properties to hydrogen or moisture, such as an SiN film, an $Al_2O_3$ film, a $Ta_2O_5$ film or the like. However, if the lower layer film is constructed of the film having high barrier properties to hydrogen or moisture, the upper layer film may be constructed of $SiO_2$ or other film having low barrier properties. Alternatively, the upper layer film may be formed of material containing a constituent substance of PZT, such as $TiO_2$.

Modification

Figure 7:
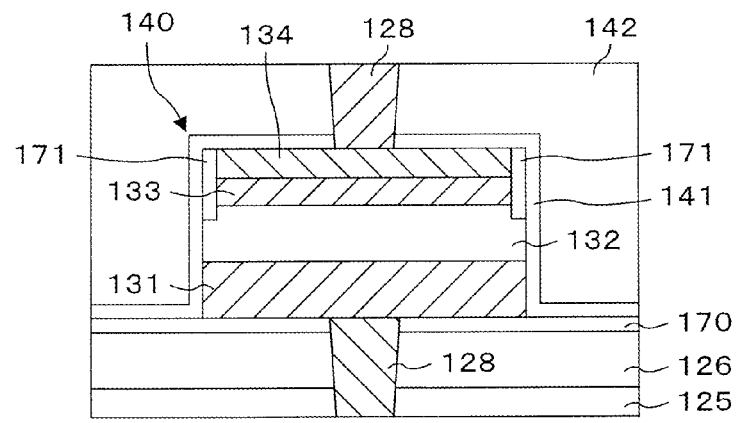
FIG. 7 is a schematic view depicting a structure of a semiconductor device according to a first modification.
Figure 8:
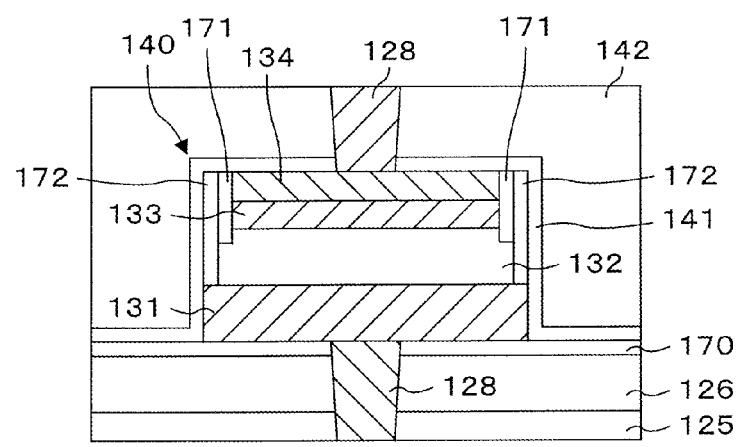
FIG. 8 is a schematic view depicting a structure of a semiconductor device according to a second modification.

FIGS. 7 to 9 are schematic views depicting structures of semiconductor devices of a first to a third modifications. FIGS. 7 to 9 depict only a ferroelectric capacitor and portions adjacent thereto. In addition, in FIGS. 7 to 9, the same reference numeral is given to the same part in FIG. 3T.

In the semiconductor device depicted in FIG. 7, a water-resistant film 170 which prevents entry of moisture into a ferroelectric capacitor 140 is formed on an $SiO_2$ film 126. The water-resistant film 170 is formed of a plasma SiON film or an aluminum oxide. A ferroelectric capacitor 140 is formed on the water-resistant film 170.

An insulating protective film 171 covers not only side surfaces of a Pt film 134 and an upper electrode film 133, but also portions (upper side portions) of a ferroelectric film 132. The ferroelectric capacitor 140 and the insulating protective film 171 are covered with the capacitor protective film 141 composed of alumina, or the like.

In a semiconductor device depicted in FIG. 8, a water-resistant film 170 is formed on an $SiO_2$ film 126, and a ferroelectric capacitor 140 is formed on a water-resistant film 170, similar to the semiconductor device depicted in FIG. 7. Then, the insulating protective film 171 covers the entire side surfaces of a Pt film 134 and an upper electrode 133, as well as portion of a side surface of the ferroelectric film 132.

An insulating protective film 172 is formed to overlap the insulating protective film 171, and covers the entire side surface of the ferroelectric film 132.

In a semiconductor device depicted in FIG. 9, a water-resistant film 170 is formed on an $SiO_2$ film 126, and a ferroelectric capacitor 140 is formed on a water-resistant film 170, similar to the semiconductor device depicted in FIG. 7. An insulating protective film 173 covers the entire side surfaces of a Pt film 137, an upper electrode film 133, and a ferroelectric film 132.

In the semiconductor devices depicted in FIG. 7 to FIG. 9 also, similar to the first to third embodiments, the effect that a short of the ferroelectric capacitor 140 due to conductive particles generated during etching can be prevented is achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:

forming an insulation film on a semiconductor substrate;

forming a lower electrode film on the insulation film;

forming a ferroelectric film on the lower electrode film;

forming an upper electrode film on the ferroelectric film;

forming a hard mask of a predetermined pattern on the upper electrode film;

removing the upper electrode film on a portion uncovered with the hard mask;

forming a first insulating protective film on an entire upper surface of the semiconductor substrate and covering a side surface of the remaining upper electrode film with the first insulating protective film;

removing the ferroelectric film on the portion uncovered with the hard mask, and covering the side surface of the remaining upper electrode film with the first insulating protective film;

forming a second insulating protective film on the entire upper surface of the semiconductor substrate and covering a side surface of the remaining ferroelectric film with the second insulating protective film;

removing the lower electrode film on the portion uncovered with the hard mask; and removing the hard mask, wherein, in the removing of the lower electrode film on the portion uncovered with the hard mask, the lower electrode film on the portion uncovered with the hard mask is removed while covering the side surface of the remaining upper electrode film with the first insulating protective film and covering the side surface of the remaining ferroelectric film with the second insulating protective film.

2. The method of manufacturing a semiconductor device according to claim 1, wherein the first insulating protective film and the second insulating protective film are each made to be 5 to 20 nm thick.

3. The method of manufacturing a semiconductor device according to claim 1, wherein temperature in film formation of the first insulating protective film and the second insulating protective film is less than 300° C.

4. The method of manufacturing a semiconductor device according to claim 1, wherein the first insulating protective film and the second insulating protective film are formed by a CVD method or an ALD method.

5. The method of manufacturing a semiconductor device according to claim 1, wherein the first insulating protective film and the second insulating protective film are each composed of at least one kind of insulation film selected from the group consisting of an SiN film, an $Al_2O_3$ film, a $Ta_2O_5$ film, and an SiC film.

* * * * *